United States Patent
Lee et al.

(10) Patent No.: US 11,942,143 B2
(45) Date of Patent: Mar. 26, 2024

(54) SEMICONDUCTOR MEMORY DEVICES

(71) Applicant: Samsung Electronics Co., Ltd., Suwon-si (KR)

(72) Inventors: Chanho Lee, Hwaseong-si (KR); Jung-Hak Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 17/559,110

(22) Filed: Dec. 22, 2021

(65) Prior Publication Data
US 2022/0343966 A1    Oct. 27, 2022

(30) Foreign Application Priority Data
Apr. 23, 2021    (KR) .................. 10-2021-0053270

(51) Int. Cl.
| | | |
|---|---|---|
| *G11C 11/4097* | (2006.01) | |
| *G11C 11/4074* | (2006.01) | |
| *G11C 11/4076* | (2006.01) | |
| *G11C 11/408* | (2006.01) | |
| *G11C 11/4094* | (2006.01) | |
| *G11C 11/4096* | (2006.01) | |

(52) U.S. Cl.
CPC ...... *G11C 11/4087* (2013.01); *G11C 11/4074* (2013.01); *G11C 11/4076* (2013.01); *G11C 11/4085* (2013.01); *G11C 11/4094* (2013.01); *G11C 11/4096* (2013.01)

(58) Field of Classification Search
CPC ............ G11C 11/4087; G11C 11/4074; G11C 11/4076; G11C 11/4085; G11C 11/4094; G11C 11/4096; G11C 8/08; G11C 11/418; G11C 16/08; G11C 8/10; G11C 8/06; G11C 7/22; G11C 8/18
See application file for complete search history.

(56) References Cited

U.S. PATENT DOCUMENTS

| | | |
|---|---|---|
| 6,314,044 B1 | 11/2001 | Sasaki et al. |
| 10,192,602 B2 | 1/2019 | Berger et al. |
| 10,528,495 B2 | 1/2020 | Rusten |
| 10,664,601 B2 | 5/2020 | Wang et al. |
| 10,831,637 B2 | 11/2020 | Barsness et al. |
| 2016/0064044 A1 | 3/2016 | Stansfield |
| 2020/0219560 A1* | 7/2020 | Sasaki ............ G11C 16/26 |
| 2020/0243153 A1* | 7/2020 | Kumar ............ G11C 29/38 |

FOREIGN PATENT DOCUMENTS

| | | |
|---|---|---|
| JP | 4039532 B2 | 1/2008 |
| KR | 10-2018-0136237 A | 12/2018 |
| KR | 10-2160562 B1 | 9/2020 |

* cited by examiner

*Primary Examiner* — Xiaochun L Chen
(74) *Attorney, Agent, or Firm* — Harness, Dickey & Pierce, P.L.C.

(57) ABSTRACT

A semiconductor memory device includes a memory cell array that includes memory cells arranged in rows and columns, a row decoder that is configured to receive a row address, decode the row address, and adjust voltages of selection lines based on the decoded row address, a word line driver that is connected with the selection lines, is connected with the rows of the memory cells through word lines, and is configured to adjust voltages of the word lines in response to an internal clock signal and the voltages of the selection lines, and a detection circuit that is connected with the word lines and is configured to activate a detection signal in response to voltages of the word lines being identical at a specific timing.

19 Claims, 17 Drawing Sheets

SEMICONDUCTOR MEMORY DEVICES

CROSS-REFERENCE TO RELATED APPLICATIONS

This application claims priority under 35 U.S.C. § 119 to Korean Patent Application No. 10-2021-0053270 filed on Apr. 23, 2021, in the Korean Intellectual Property Office, the disclosures of which are incorporated by reference herein in their entireties.

BACKGROUND

Example embodiments of the present inventive concepts described herein relate to electronic devices, and more particularly, relate to semiconductor memory devices that improve reliability by detecting an address overflow.

A semiconductor memory device is used to store data. The semiconductor memory device is an essential component constituting an electronic device. For example, an automotive system is also implemented to store data by using the semiconductor memory device.

One of abnormal operations that occur at the semiconductor memory device is an address overflow. The address overflow may occur when the semiconductor memory device is accessed by using an address outside a range of addresses allocated to the semiconductor memory device. When the address overflow occurs in a write operation, the semiconductor memory device may not write data. When the address overflow occurs in a read operation, the semiconductor memory device may output random data.

Because the automotive system is associated with an operation of a vehicle, the automotive system requires high reliability. When the address overflow occurs at a semiconductor memory device used in the automotive system, the automotive system may abnormally operate, which may result in a traffic accident.

SUMMARY

Some example embodiments of the present inventive concepts provide a semiconductor memory device configured to detect an address overflow internally.

According to some example embodiments, a semiconductor memory device may include a memory cell array that includes memory cells arranged in rows and columns, a row decoder that is configured to receive a row address, decode the row address, and adjust voltages of selection lines based on the decoded row address, a word line driver that is connected with the selection lines, is connected with the rows of the memory cells through word lines, and is configured to adjust voltages of the word lines in response to an internal clock signal and the voltages of the selection lines, and a detection circuit that is connected with the word lines and is configured to activate a detection signal in response to voltages of the word lines being identical at a specific timing.

According to some example embodiments, a semiconductor memory device may include a memory cell array that includes memory cells arranged in rows and columns, a row decoder that is configured to receive a row address, to decode the row address and adjust voltages of selection lines based on the decoded row address, a word line driver that is connected with the selection lines and word lines and is configured to adjust voltages of the word lines in response to the voltages of the selection lines, and a detection circuit that is connected with the selection lines and is configured to activate a detection signal in response to the voltages of the selection lines being identical at a specific timing.

According to some example embodiments, a semiconductor memory device may include a memory cell array that includes memory blocks, each of which includes memory cells, and a row driver connected with the memory cell array through word lines. The row driver may include a decoder that is configured to adjust voltages of selection lines based on a row address, pass switches that respectively correspond to the memory blocks and are connected with the memory blocks through the word lines, a driver that is connected in common with the pass switches through transmission lines and is configured to adjust voltages of the transmission lines based on an enable signal and the voltages of the selection lines, a block decoder that is configured to activate one pass switch of the pass switches and deactivate a remainder of the pass switches, based on the row address, and a detection circuit that is connected with the selection lines and is configured to activate a detection signal in response to the voltages of the selection lines being identical at a specific timing. Each of the pass switches may be connected with a corresponding memory block of the memory blocks through some corresponding word lines of the word lines, and the activated one pass switch of the pass switches may be configured to transfer the voltages of the transmission lines to some word lines corresponding to the activated one pass switch from among the word lines.

BRIEF DESCRIPTION OF THE DRAWINGS

The above and other objects and features of the present inventive concepts will become apparent by describing in detail some example embodiments thereof with reference to the accompanying drawings.

DETAILED DESCRIPTION

Figure 1:
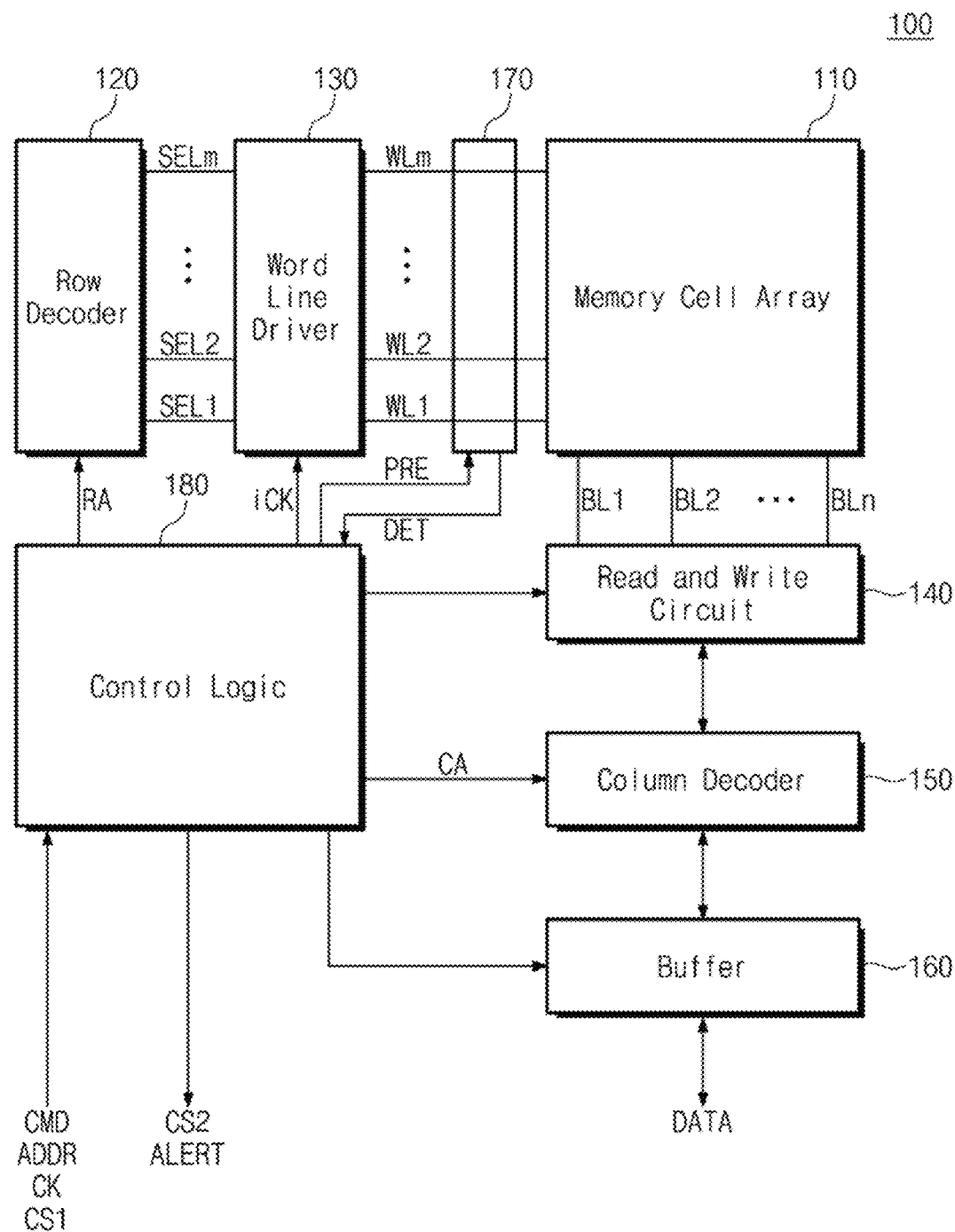
FIG. 1 illustrates a semiconductor memory device according to some example embodiments of the present inventive concepts.

Below, some example embodiments of the present inventive concepts may be described in detail and clearly to such an extent that an ordinary one in the art easily implements the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 illustrates a semiconductor memory device 100 according to some example embodiments of the present inventive concepts. Referring to FIG. 1, the semiconductor memory device 100 may include a memory cell array 110, a row decoder 120, a word line driver 130, a read and write circuit 140, a column decoder 150, a buffer 160, a detection circuit 170, and control logic 180. The control logic 180 may be referred to herein interchangeably as control circuitry.

The memory cell array 110 may include memory cells arranged in rows and columns. Rows of memory cells in the memory cell array 110 may be connected with first to m-th word lines WL1 to WLm, where "m" is any positive integer. Columns of memory cells in the memory cell array 110 may be connected with first to n-th bit lines BL1 to BLn, where "n" is any positive integer.

The row decoder 120 may operate under control of the control logic 180. The row decoder 120 may receive a row address RA from the control logic 180. The row decoder 120 may adjust voltages of first to m-th selection lines SEL1 to SELm, based on the row address RA. The row decoder 120 may receive the row address RA, decode the row address RA, and adjust voltages of first to m-th selection lines SEL1 to SELm, based on the decoded row address RA. For example, when an address overflow does not occur, the row decoder 120 may select one selection line of the first to m-th selection lines SEL1 to SELm and may apply a first voltage (e.g., a high level or a low level) to the selected selection line. The row decoder 120 may not select the remaining selection lines of the first to m-th selection lines SEL1 to SELm and may apply a second voltage (e.g., the low level or the high level) to the remaining selection lines not selected. As referred to herein, a "high level" and "low level" of a voltage and/or signal may refer to a magnitude of the voltage and/or signal. For example, a first voltage having a high level may have a magnitude that is greater than a magnitude of a second voltage having a low level.

The word line driver 130 may operate under control of the control logic 180. The word line driver 130 may be connected with the first to m-th selection lines SEL1 to SELm and may be connected with the first to m-th word lines WL1 to WLm. The first to m-th selection lines SEL1 to SELm may correspond to the first to m-th word lines WL1 to WLm, respectively. The word line driver 130 may receive an internal clock signal iCK from the control logic 180.

In response to voltages of the first to m-th selection lines SEL1 to SELm and the internal clock signal iCK, the word line driver 130 may adjust voltages of the first to m-th word lines WL1 to WLm. For example, the word line driver 130 may apply the first voltage (e.g., a write voltage or a read voltage) to a selected word line, which corresponds to a selected selection line, from among the first to m-th word lines WL1 to WLm. The word line driver 130 may apply the second voltage (e.g., a write-inhibit voltage or a read-inhibit voltage) to unselected word lines, which respectively correspond to unselected selection lines, from among the first to m-th word lines WL1 to WLm.

The read and write circuit 140 may operate under control of the control logic 180. The read and write circuit 140 may be connected with the first to n-th bit lines BL1 to BLn. The read and write circuit 140 may apply voltages for a write operation to the first to n-th bit lines BL1 to BLn or may perform a read operation by sensing voltages of the first to n-th bit lines BL1 to BLn. The read and write circuit 140 may include write drivers that are respectively connected with the first to n-th bit lines BL1 to BLn and perform the write operation, and sense amplifiers that are respectively connected with the first to n-th bit lines BL1 to BLn and perform the read operation.

The column decoder 150 may operate under control of the control logic 180. The column decoder 150 may receive a column address CA from the control logic 180. Based on the column address CA, the column decoder 150 may connect a part of the write drivers of the read and write circuit 140 with the buffer 160 or may connect a part of the sense amplifiers thereof with the buffer 160.

The buffer 160 may operate under control of the control logic 180. The buffer 160 may exchange data "DATA" with an external device. The buffer 160 may exchange the data "DATA" with the column decoder 150. The buffer 160 may be used as an input and output buffer.

The detection circuit 170 may operate under control of the control logic 180. The detection circuit 170 may be connected with the first to m-th word lines WL1 to WLm. For example, the detection circuit 170 may be implemented to have no influence on voltages of the first to m-th word lines WL1 to WLm.

The detection circuit 170 may receive a precharge signal PRE from the control logic 180. The detection circuit 170 may provide a detection signal DET to the control logic 180. In response to the precharge signal PRE being deactivated, the detection circuit 170 may be initialized (or reset). In an initialization (or reset) state, the detection signal DET may be fixed. Where the detection circuit 170 is configured to activate a detection signal DET in response to the voltages of the word lines WL1 to WLm being identical at a specific timing, and where the control logic 180 is configured to notify the detection circuit 170 of the specific timing based on activating the precharge signal PRE, the control logic 180 may be configured to initialize the detection circuit 170 during a time period outside the specific timing based on deactivating the precharge signal PRE. In some example embodiments, when a signal is referred to as being "activated," the signal may have a first, high level or magnitude, and when the signal is referred to as being "deactivated," the signal may have a second, low level or magnitude that is smaller in magnitude than the first, high level or magnitude.

In response to the precharge signal PRE being activated, the detection circuit 170 may detect the address overflow based on voltages of the first to m-th word lines WL1 to WLm. The detection circuit 170 may output (e.g., generate, transmit, provide, etc.) a detection result as the detection signal DET. The detection circuit 170 may be configured to activate (e.g., generate, transmit, provide, etc.) the detection signal DET in response to the voltages of the first to m-th word lines WL1 to WLm being identical at a specific timing.

Figure 17:
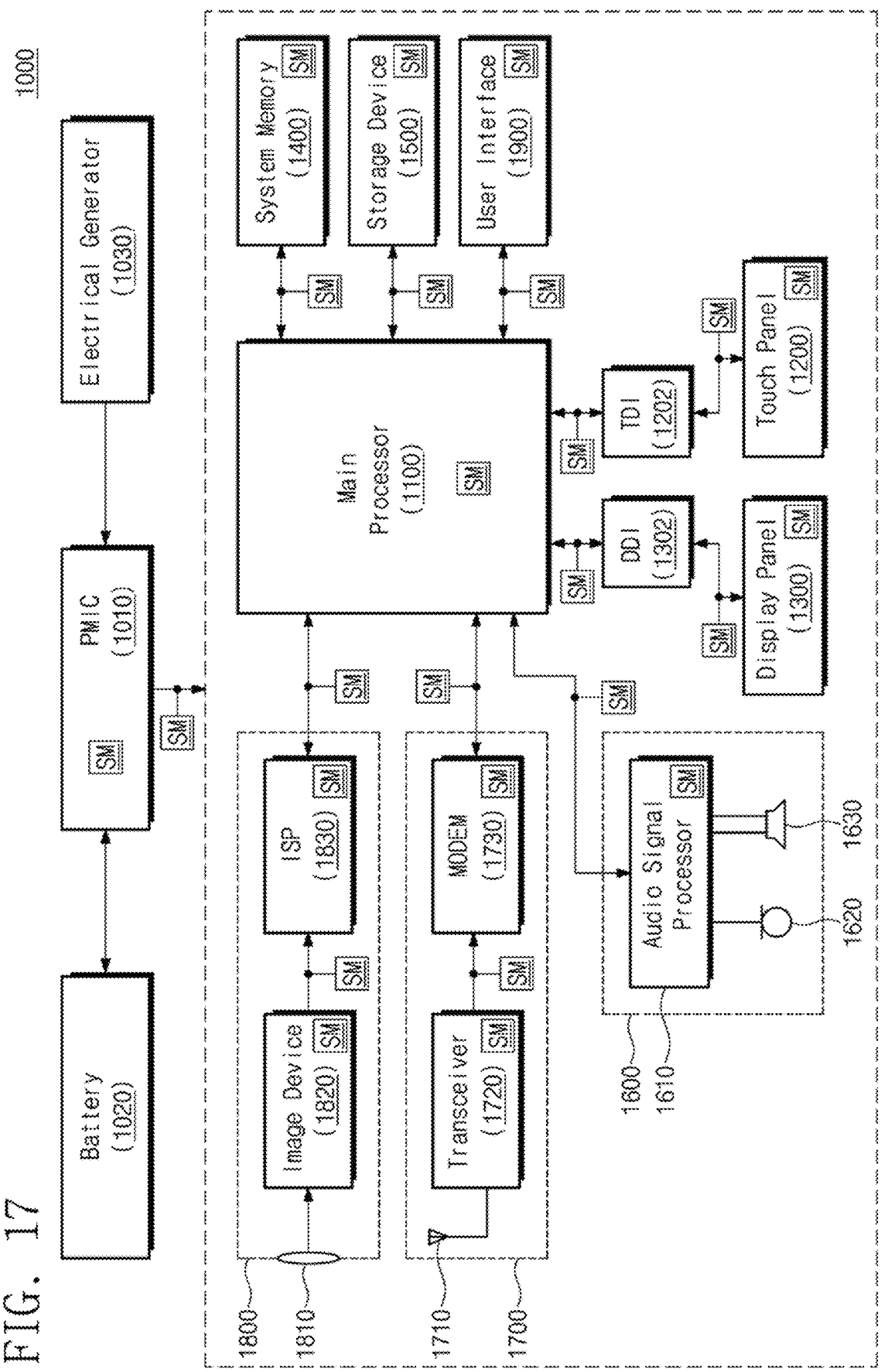
FIG. 17 is a block diagram illustrating an electronic device including a semiconductor memory device or a memory system according to some example embodiments of the present inventive concepts.

The control logic 180 may receive a command CMD, an address ADDR, a clock signal CK, and a first control signal CS1 from the external device. As referred to herein, the external device may, in some example embodiments, be a device in which the semiconductor memory device 100 is located and which is supported by the semiconductor memory device 100 (e.g., electronic device 1000 as shown in FIG. 17). In response to the command CMD, the control logic 180 may control the components of the semiconductor memory device 100 so as to perform the write operation or the read operation. The control logic 180 may receive a command CMD and an address ADDR from an external device (e.g., a device that is external to the semiconductor memory device 100) and may notify the detection circuit 170 of the specific timing based on activating (e.g., generating, transmitting, etc.) a precharge signal PRE. Activating a signal may include transmitting the signal at a certain level, or magnitude (e.g., voltage magnitude, current magnitude, etc.). Deactivating a signal may include transmitting the signal at another, separate level or magnitude. For example, a signal may be activated based on being transmitted at a first, high magnitude and may be deactivated based on being transmitted at a second, low magnitude.

The control logic 180 may extract the row address RA and the column address CA from the address ADDR. The control logic 180 may provide the row address RA to the row decoder 120 and may provide the column address CA to the column decoder 150.

The control logic 180 may generate various internal clock signals from the clock signal CK. The control logic 180 may provide the internal clock signals to the components of the semiconductor memory device 100 and thus may control operation timings of the components of the semiconductor memory device 100. For example, the control logic 180 may provide the internal clock signal iCK to the word line driver 130.

The control logic 180 may receive various control information from the external device in response to the first control signal CS1.

The control logic 180 may output a second control signal CS2 and an alert signal ALERT to the external device. The control logic 180 may provide status information of the semiconductor memory device 100 to the external device by outputting the second control signal CS2. The control logic 180 may activate the alert signal ALERT in response to a determination that the address overflow is detected. That is, the control logic 180 may notify the external device whether the address overflow occurs. By notifying the external device whether the address overflow occurs, the control logic 180 may cause the external device to implement a corrective operation to reduce or prevent abnormal operation that might otherwise occur as a result of the address overflow. For example, the notifying, via second control signal CS2 and/or the alert signal ALERT may cause the external device to refrain from using read data DATA that may be associated with the address overflow and/or may cause the external device to save and re-attempt a write operation with different address ADDR information.

Figure 2:
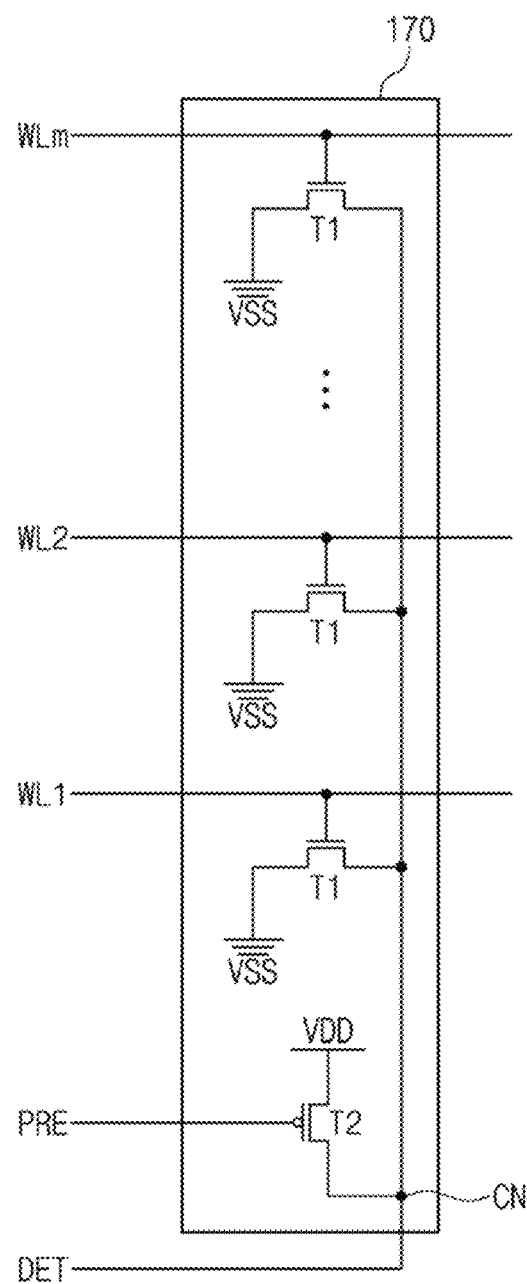
FIG. 2 illustrates an example of a detection circuit according to some example embodiments of the present inventive concepts.

FIG. 2 illustrates an example of the detection circuit 170 according to some example embodiments of the present inventive concepts. Referring to FIGS. 1 and 2, the detection circuit 170 may include first transistors T1 and a second transistor T2. In some example embodiments the second transistor T2 may be absent. As shown in FIG. 2, gates of the first transistors T1 may be respectively connected with the first to m-th word lines WL1 to WLm (e.g., a gate of each separate first transistor T1 may be connected with a separate word line, or different word line, of the first to m-th word lines WL1 to WLm). First terminals of the first transistors T1 may be connected with a ground node to which a ground voltage VSS is supplied. Accordingly, the semiconductor memory device 100 (e.g., the detection circuit 170) may be configured to apply a ground voltage VSS to first terminals of the first transistors T1. As shown in FIG. 2, second terminals of the first transistors T1 may be connected with a common node CN.

In response to at least one of voltages of the first to m-th word lines WL1 to WLm being at the high level (e.g., a power supply voltage, a write voltage, or a read voltage), at least one first transistor corresponding to the at least one voltage from among the first transistors T1 may be turned on, and thus, a voltage of the common node CN may be pulled down to the ground voltage VSS. For example, a first transistor from among the first transistors T1 and corresponding to one word line of the first to m-th word lines WL1 to WLm (e.g., the first transistor T1 corresponding to the first word line WL1 as shown in FIG. 2) may be configured to supply the ground voltage VSS to the common node CN in response to a voltage of the one word line (e.g., the first word line WL1) being different from voltages of remaining word lines of the word lines, which may include all other word lines excluding the one word line (e.g., the voltage of the first word line WL1 being different from voltages of the second to m-th word lines WL2 to WLm). For example, the first transistors T1 may be pull-down transistors. The first transistors T1 may be NMOS transistors.

The first transistors T1 may be turned off in response to all of the voltages of the first to m-th word lines WL1 to WLm being at the low level (e.g., a ground voltage, a write-inhibit voltage, or a read-inhibit voltage). That is, the first transistors T1 may electrically disconnect the common node CN from the ground node. For example, the first transistors T2 may be configured to float the common node CN in response to the voltages of all of the first to m-th word lines WL1 to WLm being identical.

A gate of the second transistor T2 may be configured to receive the precharge signal PRE. The precharge signal PRE may be applied to the gate of the second transistor T2. Accordingly, the detection circuit 170 may be configured to apply the precharge signal PRE to the gate of the second transistor T2. A power node to which a power supply voltage VDD is supplied may be connected with a first terminal of the second transistor T2. Accordingly, as shown in FIG. 2, the semiconductor memory device 100 (e.g., the detection circuit 170) may be configured to apply the power supply voltage VDD to the first terminal of the second transistor. As shown in FIG. 2, a second terminal of the second transistor T2 may be connected with the common node CN. The second transistor T2 may be a pull-up transistor. The second transistor T2 may be a PMOS transistor.

In response to the precharge signal PRE being deactivated to the low level (e.g., in response to the precharge signal PRE received at the gate of the second transistor T2 being deactivated to the low level), the second transistor T2 may be turned on to pull up a voltage of the common node CN to the power supply voltage VDD. In response the precharge signal PRE being activated to the high level (e.g., in response to the precharge signal PRE received at the gate of the second transistor T2 being activated to the high level), the second transistor T2 may be turned off to electrically disconnect the common node CN from the power node. Accordingly, The second transistor T2 may be configured to charge the common node CN with the power supply voltage VDD in response to deactivation of the precharge signal PRE that is received at the gate of the second transistor T2, and the second transistor T2 may be configured to stop charging of the common node CN with the power supply voltage VDD in response to activation of the precharge signal PRE that is received at the gate of the second transistor T2. A voltage of the common node CN may be provided as the detection signal DET. Accordingly, the detection circuit 170 may be configured to provide the voltage of the common node CN as the detection signal DET.

Figure 3:
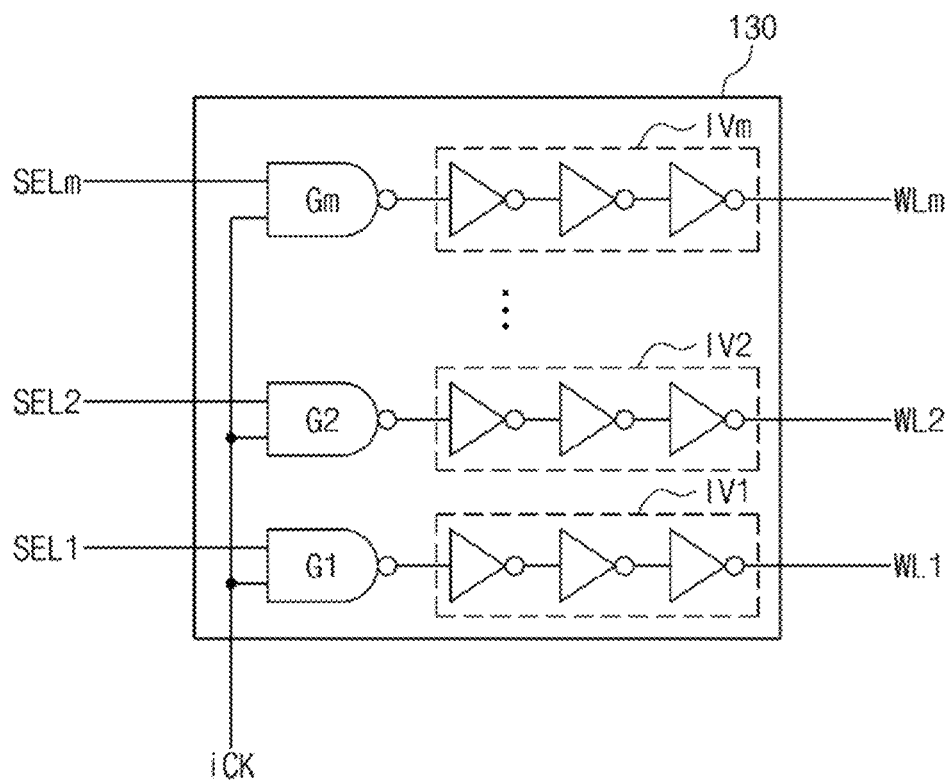
FIG. 3 illustrates an example of a word line driver according to some example embodiments of the present inventive concepts.

FIG. 3 illustrates an example of the word line driver 130 according to some example embodiments of the present inventive concepts. Referring to FIGS. 1, 2, and 3, the word line driver 130 may include first to m-th gates G1 to Gm, and first to m-th inverter groups IV1 to IVm, where "m" is any positive integer.

The first to m-th gates G1 to Gm may be connected with the first to m-th selection lines SEL1 to SELm, respectively. The first to m-th gates G1 to Gm may in common receive the internal clock signal iCK. Each of the first to m-th gates G1 to Gm may perform a NAND operation on a voltage level of the corresponding selection line of the first to m-th selection lines SEL1 to SELm and a voltage level of the internal clock signal iCK.

The first to m-th inverter groups IV1 to IVm may respectively receive operation results of the first to m-th gates G1 to Gm. The first to m-th inverter groups IV1 to IVm may invert outputs of the first to m-th gates G1 to Gm so as to be transferred to the first to m-th word lines WL1 to WLm.

Figure 4:
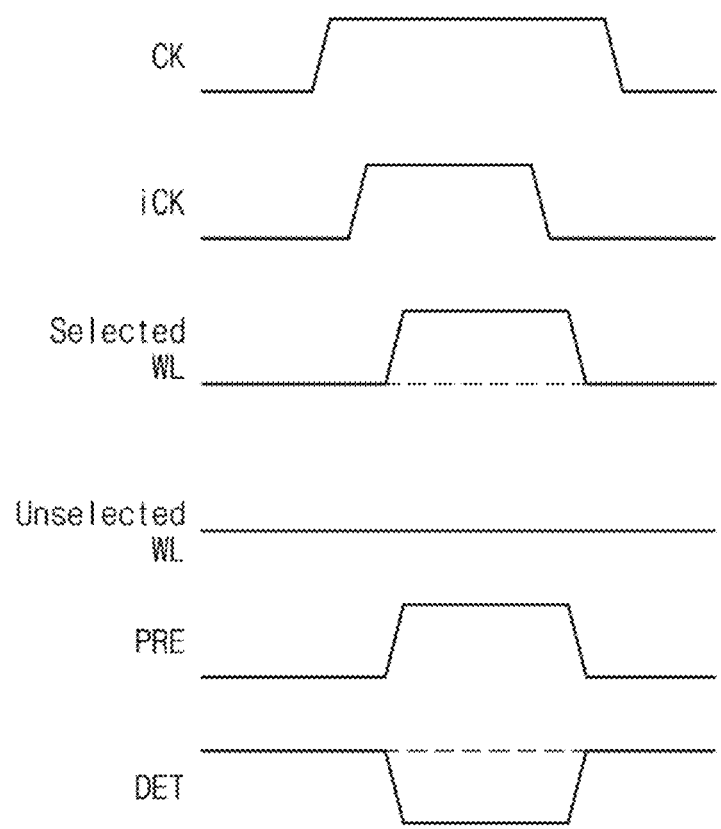
FIG. 4 illustrates timings of signals of a semiconductor memory device according to some example embodiments of the present inventive concepts.

FIG. 4 illustrates timings of signals of the semiconductor memory device 100 according to some example embodiments of the present inventive concepts. Referring to FIGS. 1, 2, 3, and 4, the control logic 180 may generate the internal clock signal iCK from the clock signal CK. While the internal clock signal iCK is at the high level, the row decoder 120 may decode the row address RA and may adjust voltages of the first to m-th selection lines SEL1 to SELm based on the decoded row address.

In some example embodiments, when the address overflow does not occur, the row decoder 120 may adjust a voltage of a selection line selected from the first to m-th selection lines SEL1 to SELm to the high level. The row decoder 120 may adjust voltages of the remaining selection lines, which are not selected, from among the first to m-th selection lines SEL1 to SELm to the low level.

While the internal clock signal iCK is at the high level, the word line driver 130 may adjust voltages of the first to m-th word lines WL1 to WLm based on voltages of the first to m-th selection lines SEL1 to SELm. For example, when the address overflow does not occur, the word line driver 130 may adjust a voltage of a selected word line, which corresponds to a selected selection line, from among the first to m-th word lines WL1 to WLm to the high level. The word line driver 130 may adjust voltages of unselected word lines corresponding to unselected selection lines from among the first to m-th word lines WL1 to WLm to the low level.

The control logic 180 may activate the precharge signal PRE from the low level to the high level in synchronization with the voltage of the selected word line being adjusted to the high level. While the precharge signal PRE is at the high level, the second transistor T2 is turned off, and the common node CN is electrically disconnected from the power node. The control logic 180 receives the command CMD and the address from an external device and may notify the detection circuit 170 of a specific timing (e.g., a specific timing associated with the detection circuit 170 determining whether the voltages of the word lines WL1 to WLm are identical) based on activating the precharge signal PRE.

In response to the voltage of the selected word line being set to the high level, a first transistor, which is connected with the selected word line, from among the first transistors T1 may be turned on. The first transistor connected with the selected word line may pull down a voltage of the common node CN to the ground voltage VSS. That is, the detection signal DET may transition from the high level to the low level.

The control logic 180 may deactivate the precharge signal PRE from the high level to the low level in synchronization with the voltage of the selected word line being adjusted to the low level. In response to the precharge signal PRE being deactivated to the low level, the second transistor T2 may be turned on to pull up a voltage of the common node CN to the power supply voltage VDD.

As marked by a solid line in FIG. 4, in response to a determination that the detection signal DET transitions from the high level to the low level and then transitions from the low level to the high level, the control logic 180 may determine that the address overflow does not occur.

In some example embodiments, when the address overflow occurs, the row decoder 120 may maintain voltages of the first to m-th selection lines SEL1 to SELm at the low level. The row decoder 120 may not select any of the first to m-th selection lines SEL1 to SELm.

While the internal clock signal iCK is at the high level, the word line driver 130 may adjust voltages of the first to m-th word lines WL1 to WLm based on voltages of the first to m-th selection lines SEL1 to SELm. For example, in the event that the address overflow occurs, because all the first to m-th selection lines SEL1 to SELm are not selected, the word line driver 130 may maintain voltages of the first to m-th word lines WL1 to WLm at the low level.

All the first transistors T1 may be turned off in response to the voltages of the first to m-th word lines WL1 to WLm being maintained at the low level. That is, the detection signal DET may maintain the high level.

As marked by a dotted line in FIG. 4, in response to a determination that the detection signal DET maintains the high level (e.g., the detection signal DET is activated), the control logic 180 may determine that the address overflow occurs. In response to a determination that the address overflow is detected (e.g., a determination that the address overflow occurs), the control logic 180 may stop and terminate a current operation (e.g., a write operation or a read operation) initiated by the command CMD. The control logic 180 may thus stop an operation corresponding to the command CMD in response to the determination that the detection signal DET is activated. Such a stopping of the operation may reduce or prevent abnormal operation of the semiconductor memory device 100 and/or an external device (e.g., electronic device 1000, an automotive system, or the like) that might otherwise result from the address overflow. The control logic 180 may notify the external device that the address overflow occurs (e.g., in response to detecting the address overflow, in response to the determination that the detection signal DET is activated, and/or in response to stopping the operation corresponding to the command CMD), by activating the alert signal ALERT (e.g., based on generating and/or transmitting an alert signal ALERT to the external device, which may be the same external device from which at least the command CMD and address ADDR are received at the control logic 180). By notifying the external device that the address overflow occurs, the control logic 180 may cause the external device to implement a corrective operation to reduce or prevent abnormal operation that might otherwise occur as a result of the address overflow. For example, in response to the control logic 180 activating the alert signal ALERT, the external device (e.g., electronic device 1000, an automotive system, or the like) may cause the external device to refrain from using read data DATA that may be associated with the address overflow and/or may cause the external device to save and re-attempt a write operation with different address ADDR information.

In some example embodiments, in synchronization with a specific timing at which the internal clock signal iCK transitions from the low level to the high level, the detection circuit 170 may allow the detection signal DET to transition from the high level to the low level and then to transition from the low level to the high level, and thus, the detection signal DET may be regarded as deactivated. In synchronization with the specific timing at which the internal clock signal iCK transitions from the low level to the high level, the detection circuit 170 may maintain the detection signal DET at the high level, and thus, the detection signal DET may be regarded as activated. The detection circuit 170 may activate the detection signal DET in response to the voltages of the word lines WL1 to WLm being identical at the specific timing. The control logic 180 may receive the command CMD and the address ADDR from an external device and may notify the detection circuit 170 of the specific timing based on activating the precharge signal PRE. The control logic 180 may initialize the detection circuit 170 during a time period outside the specific timing based on deactivating the precharge signal PRE. The control logic 180 may stop an operation corresponding to the command CMD in response to a determination that the detection signal DET is activated. The control logic 180 may transmit an alert signal ALERT to the external device in response to a determination that the detection signal DET is activated. The control logic 180 may be configured to determine and/or identify that the detection signal DET is activated in response to the voltage at the common node CN of the detection circuit 170 being maintained at the power supply voltage VDD at the specific timing. The specific timing may be a timing at which, in response to the command CMD, the word line driver 130 applies a first voltage to a selected word line of the first to m-th word lines WL1 to WLm (e.g., the first word line WL1) and applies second voltages to unselected word lines of the first to m-th word lines WL1 to WLm, which may be a portion of the first to m-th word lines WL1 to WLm that excludes the selected word line (e.g., the unselected word lines may be the second to m-th word lines WL2 to WLm).

As described above, the semiconductor memory device 100 may automatically detect the address overflow, thereby improving the reliability of the semiconductor memory device 100 in reducing or preventing abnormal operations of a device (e.g., the external device) supported by the semiconductor memory device 100 due to address overflow in the semiconductor memory device 100, only by adding the first transistors T1 to the first to m-th word lines WL1 to WLm and adding the second transistor T2. That is, the reliability of the semiconductor memory device 100 may be improved without an increase in the size and complexity thereof.

In some example embodiments, to control the precharge signal PRE, delay units corresponding to a delay amount by which the word line driver 130 illustrated in FIG. 3 delays the internal clock signal iCK may be provided in the control logic 180. The control logic 180 may input the internal clock signal iCK to the delay units and may use a final output of the delay units as the precharge signal PRE.

Figure 5:
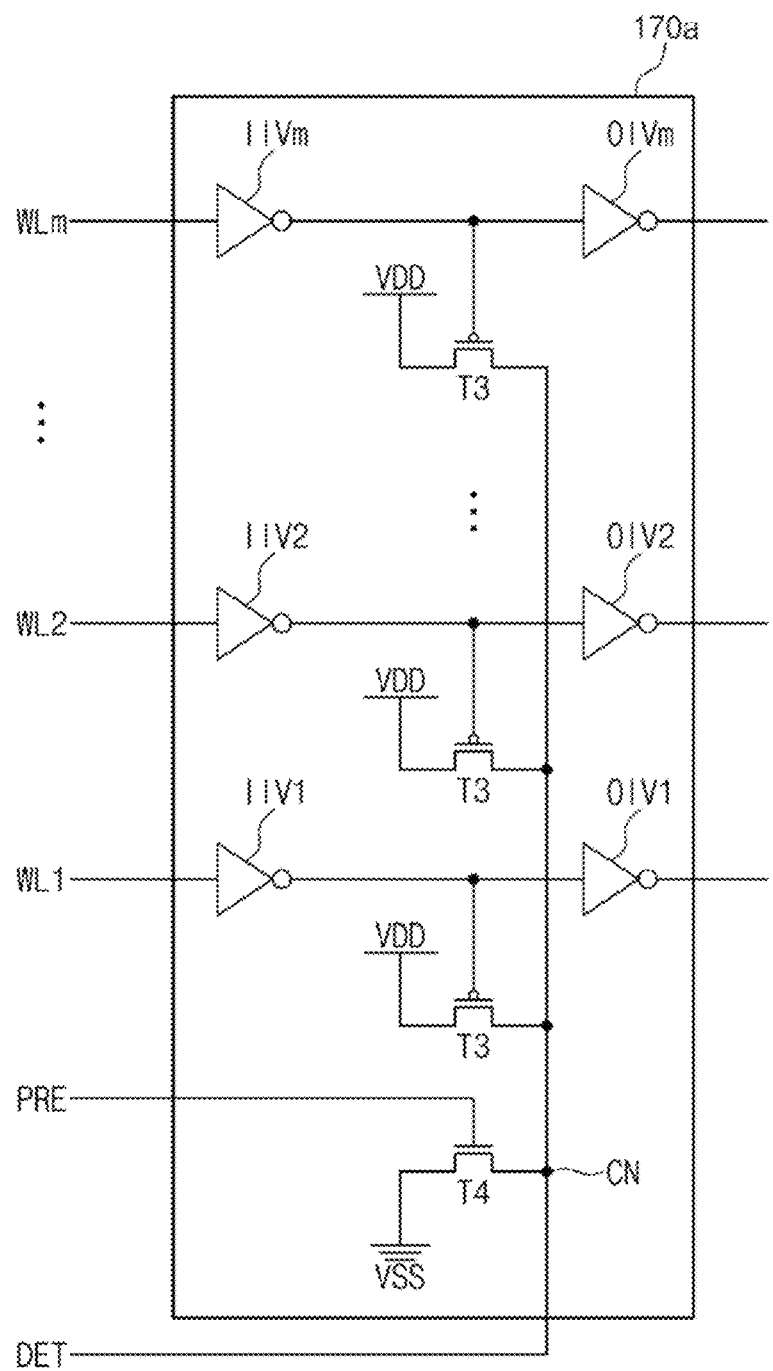
FIG. 5 illustrates a detection circuit according to some example embodiments of the present inventive concepts.

FIG. 5 illustrates a detection circuit 170a according to some example embodiments of the present inventive concepts. Referring to FIGS. 1 and 5, the detection circuit 170a may include first to m-th input inverters IIV1 to IIVm, first to m-th output inverters OIV1 to OIVm, third transistors T3 (which may in some example embodiments be referred to as first transistors of the detection circuit 170a), and a fourth transistor T4 (which may in some example embodiments be referred to as a second transistor of the detection circuit 170a), where "m" is any positive integer.

The first to m-th input inverters IIV1 to IIVm may invert and output voltages of the first to m-th word lines WL1 to WLm. The first to m-th output inverters OIV1 to OIVm may invert and output outputs of the first to m-th input inverters IIV1 to IIVm. It may be regarded as the first to m-th input inverters IIV1 to IIVm and the first to m-th output inverters OIV1 to OIVm transfer voltages of the first to m-th word lines WL1 to WLm to the memory cell array 110 without having an influence on the voltages of the first to m-th word lines WL1 to WLm.

Gates of the third transistors T3 may be respectively connected with the outputs of the first to m-th input inverters IIV1 to IIVm. First terminals of the third transistors T3 may be connected with the power node to which the power supply voltage VDD is supplied. Accordingly, the detection circuit 170 may be configured to apply the power supply voltage VDD to the first terminals of the third transistors T3. Second terminals of the third transistors T3 may be connected with the common node CN. In response to at least one of output voltages of the first to m-th output inverters OIV1 to OIVm being at the low level (e.g., a ground voltage, a write-inhibit voltage, or a read-inhibit voltage), at least one third transistor corresponding to the at least one voltage from among the third transistors T3 may be turned on, and thus, a voltage of the common node CN may be pulled up to the power supply voltage VDD. For example, the third transistors T3 may be pull-up transistors. The third transistors T3 may be PMOS transistors.

The third transistors T3 may be turned off in response to all the input voltages of the first to m-th output inverters OIV1 to OIVm being at the high level (e.g., a power supply voltage, a write voltage, or a read voltage). That is, the third transistors T3 may electrically disconnect the common node CN from the power node.

The precharge signal PRE may be applied to a gate of the fourth transistor T4. Accordingly, the fourth transistor T4 may be understood to be configured to receive the precharge signal PRE. The ground node to which the ground voltage VSS is supplied may be connected with a first terminal of the fourth transistor T4. Accordingly, the detection circuit 170a may be configured to apply a ground voltage VSS to a first terminal of the fourth transistor T4. A second terminal of the fourth transistor T4 may be connected with the common node CN. The fourth transistor T4 may be a pull-down transistor. The fourth transistor T4 may be an NMOS transistor.

In response to the precharge signal PRE being deactivated to the high level, the fourth transistor T4 may be turned on to pull down a voltage of the common node CN to the ground voltage VSS. In response to the precharge signal PRE being activated to the low level, the fourth transistor T4 may be turned off to electrically disconnect the common node CN from the ground node. A voltage of the common node CN may be provided as the detection signal DET.

In some example embodiments, the first to m-th input inverters IIV1 to IIVm or the first to m-th output inverters OIV1 to OIVm may be implemented to replace inverters of the first to m-th delay groups IV1 to IVm of FIG. 3. For example, at least one of inverters of each of the first to m-th delay groups IV1 to IVm may be implemented with the corresponding input inverter or the corresponding output inverter.

Figure 6:
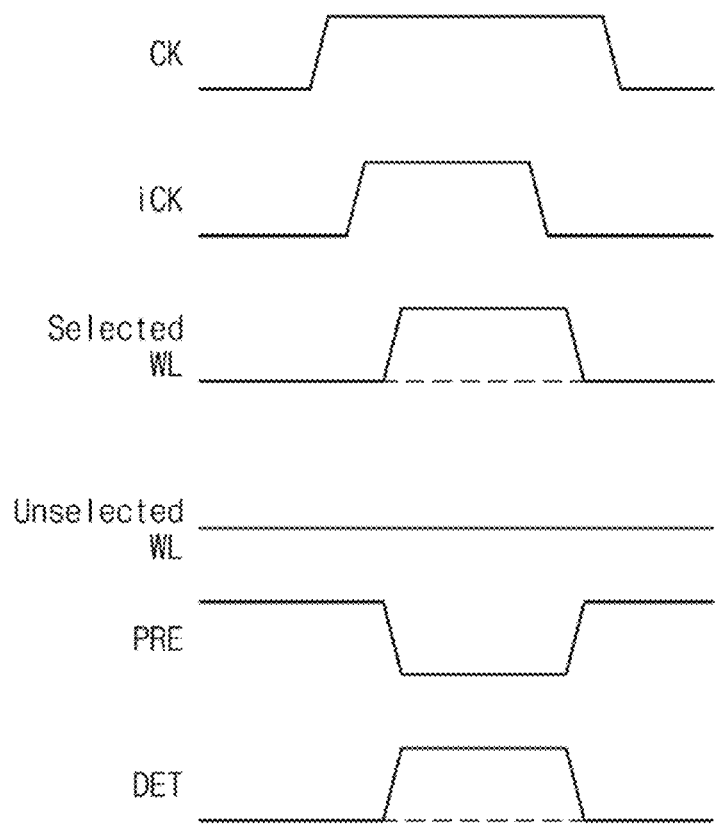
FIG. 6 illustrates timings of signals of a semiconductor memory device according to some example embodiments of the present inventive concepts.

FIG. 6 illustrates timings of signals of the semiconductor memory device 100 according to some example embodiments of the present inventive concepts. Referring to FIGS. 1, 2, 5, and 6, the control logic 180 may generate the internal clock signal iCK from the clock signal CK. While the internal clock signal iCK is at the high level, the row decoder 120 may decode the row address RA and may adjust voltages of the first to m-th selection lines SEL1 to SELm based on the decoded row address.

The clock signal CK, the internal clock signal iCK, a voltage of a selected word line, and a voltage of an unselected word line are controlled to be identical to those described with reference to FIG. 4, except for the precharge signal PRE and the detection signal DET. Thus, additional description will be omitted to avoid redundancy.

The control logic 180 may activate the precharge signal PRE from the high level to the low level in synchronization with the voltage of the selected word line being adjusted to the high level. While the precharge signal PRE is at the low level, the fourth transistor T4 is turned off, and the common node CN is electrically disconnected from the ground node.

When the address overflow does not occur, in response to the voltage of the selected word line being set to the high level, a third transistor, which is connected with the selected word line, from among the third transistors T3 may be turned on. The third transistor connected with the selected word line may pull up a voltage of the common node CN to the power supply voltage VDD. That is, the detection signal DET may transition from the low level to the high level.

The control logic 180 may deactivate the precharge signal PRE from the low level to the high level in synchronization with the voltage of the selected word line being adjusted to the low level. In response to the precharge signal PRE being deactivated to the high level, the fourth transistor T4 may be turned on to pull down a voltage of the common node CN to the ground voltage VSS.

As marked by a solid line in FIG. 6, in response to a determination that the detection signal DET transitions from the low level to the high level and then transitions from the high level to the low level, the control logic 180 may determine that the address overflow does not occur.

When the address overflow occurs, all the third transistors T3 may be turned off in response to the voltages of the first to m-th word lines WL1 to WLm being maintained at the low level. That is, the detection signal DET may maintain the low level.

As marked by a dotted line in FIG. 6, in response to a determination that the detection signal DET maintains the low level, the control logic 180 may determine that the address overflow occurs. In response to a determination that the address overflow is detected, the control logic 180 may stop and terminate a current operation (e.g., a write operation or a read operation) initiated by the command CMD. The control logic 180 may thus stop an operation corresponding to the command CMD in response to the determination that the detection signal DET is activated. Such a stopping of the operation may reduce or prevent abnormal operation of the semiconductor memory device 100 and/or an external device (e.g., electronic device 1000, an automotive system, or the like) that might otherwise result from the address overflow. The control logic 180 may notify the external device that the address overflow occurs, by activating the alert signal ALERT. By notifying the external device that the address overflow occurs, the control logic 180 may cause the external device to implement a corrective operation to reduce or prevent abnormal operation that might otherwise occur as a result of the address overflow. For example, in response to the control logic 180 activating the alert signal ALERT, the external device (e.g., electronic device 1000, an automotive system, or the like) may cause the external device to refrain from using read data DATA that may be associated with the address overflow and/or may cause the external device to save and re-attempt a write operation with different address ADDR information.

In some example embodiments, in synchronization with a specific timing at which the internal clock signal iCK transitions from the low level to the high level, the detection circuit 170 may allow the detection signal DET to transition from the low level to the high level and then to transition from the high level to the low level, and thus, the detection signal DET may be regarded as deactivated. In synchronization with the specific timing at which the internal clock signal iCK transitions from the low level to the high level, the detection circuit 170 may maintain the detection signal DET at the low level, and thus, the detection signal DET may be regarded as activated.

Figure 7:
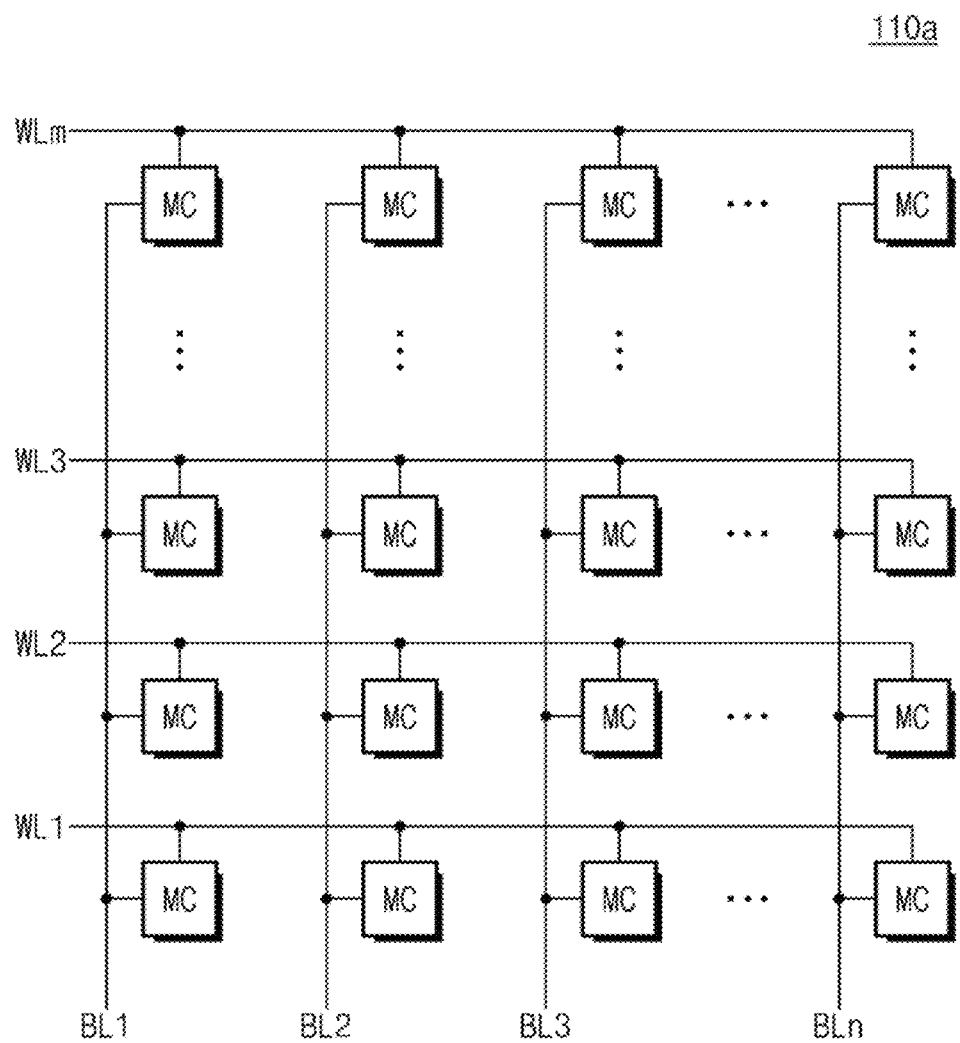
FIG. 7 illustrates a memory cell array according to some example embodiments.

FIG. 7 illustrates a memory cell array 110a according to some example embodiments. Referring to FIGS. 1 and 7, rows of the memory cells MC may be respectively connected with the first to m-th word lines WL1 to WLm, where "m" is any positive integer. Columns of the memory cells MC may be connected to the first to n-th bit lines BL1 to BLn, where "n" is any positive integer.

Figure 8:
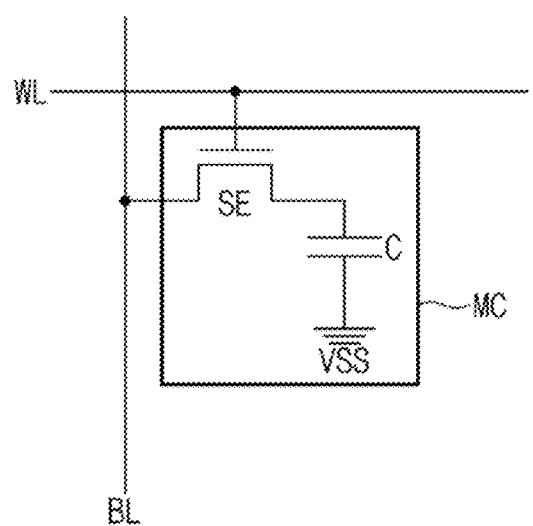
FIG. 8 illustrates an example of a memory cell of FIG. 7 according to some example embodiments of the present inventive concepts.

FIG. 8 illustrates an example of the memory cell MC of FIG. 7. In some example embodiments, an example of the memory cell MC connected with one bit line BL and one word line WL is illustrated in FIG. 8. Referring to FIGS. 1, 7, and 8, the memory cell MC may include a selection transistor SE and a capacitive element "C".

A gate of the selection transistor SE is connected to the word line WL. A first terminal of the selection transistor SE is connected to the bit line BL. A second terminal of the selection transistor ST is connected to the capacitive element "C". The capacitive element "C" may be implemented with a capacitor. The memory cell MC may be implemented with a dynamic random access memory cell.

Figure 9:
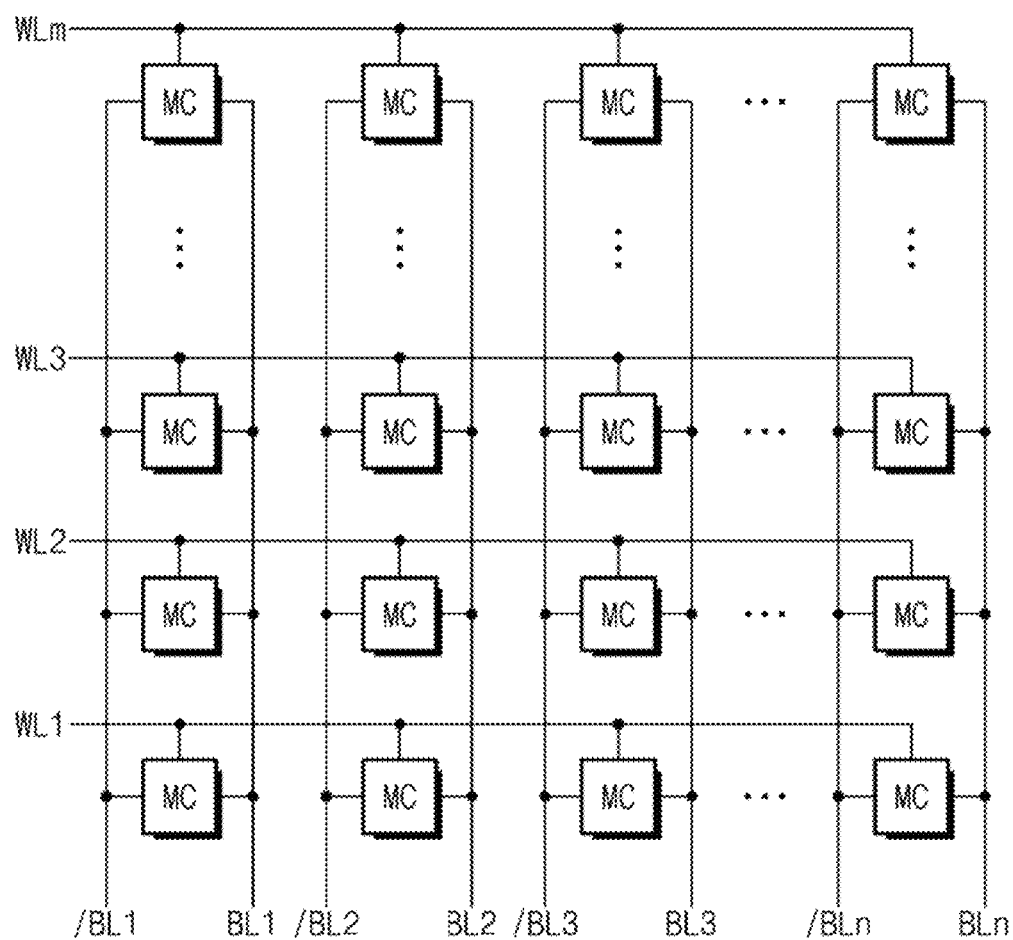
FIG. 9 illustrates a memory cell array according to some example embodiments.

FIG. 9 illustrates a memory cell array 110b according to some example embodiments. Referring to FIGS. 1 and 9, rows of the memory cells MC may be respectively connected with the first to m-th word lines WL1 to WLm, where "m" is any positive integer. Columns of the memory cells MC may be respectively connected with the first to n-th bit lines BL1 to BLn and may be respectively connected with first to n-th complementary bit lines /BL1 to /BLn, where "n" is any positive integer.

Figure 10:
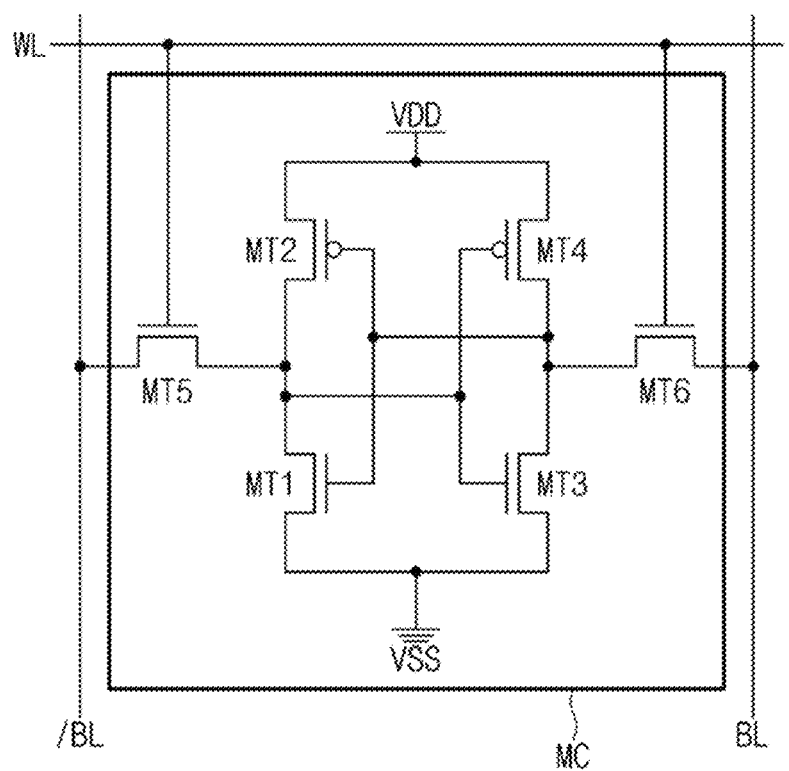
FIG. 10 illustrates an example of a memory cell of FIG. 9 according to some example embodiments of the present inventive concepts.

FIG. 10 illustrates an example of the memory cell MC of FIG. 9. In some example embodiments, an example of the memory cell MC connected with one bit line BL and one complementary bit line /BL is illustrated in FIG. 10. Referring to FIGS. 1, 9, and 10, the memory cell MC may include first to sixth memory transistors MT1 to MT6.

The first memory transistor MT1 and the second memory transistor MT2 may be connected in series between the power node and the ground node. A gate of the first memory transistor MT1 and a gate of the second memory transistor MT2 may be connected with a first terminal of the sixth memory transistor MT6.

The third memory transistor MT3 and the fourth memory transistor MT4 may be connected in series between the power node and the ground node. A gate of the third memory transistor MT3 and a gate of the fourth memory transistor MT4 may be connected with a first terminal of the fifth memory transistor MT5.

A gate of the fifth memory transistor MT5 may be connected with the word line WL. A second terminal of the fifth memory transistor MT5 may be connected with the complementary bit line /BL. A gate of the sixth memory transistor MT6 may be connected with the word line WL. A second terminal of the sixth memory transistor MT6 may be connected with the bit line BL. In some example embodiments, the memory cell MC may be implemented with a static random access memory cell.

Figure 11:
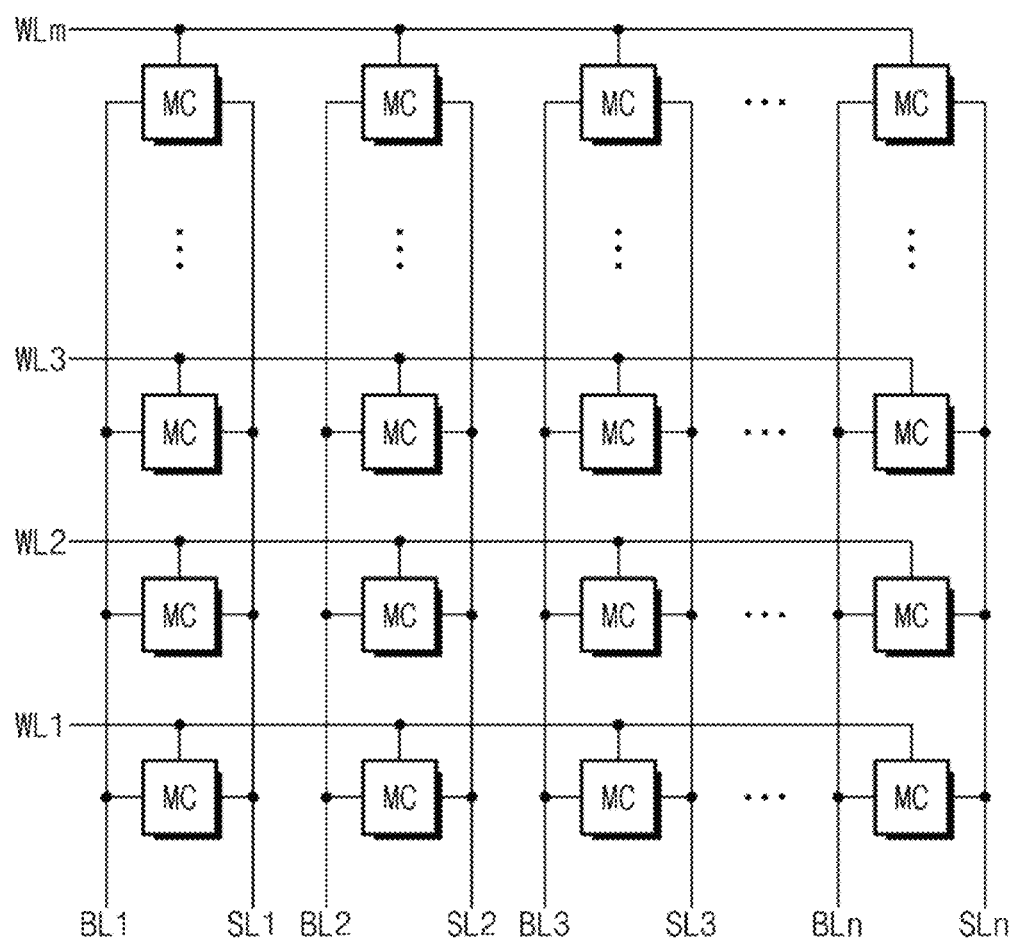
FIG. 11 illustrates a memory cell array according to some example embodiments.

FIG. 11 illustrates a memory cell array 110c according to some example embodiments. Referring to FIGS. 1 and 11, rows of the memory cells MC may be respectively connected with the first to m-th word lines WL1 to WLm, where "m" is any positive integer. Columns of the memory cells MC may be respectively connected with the first to n-th bit lines BL1 to BLn and may be respectively connected with first to n-th source lines SL1 to SLn, where "n" is any positive integer.

Figure 12:
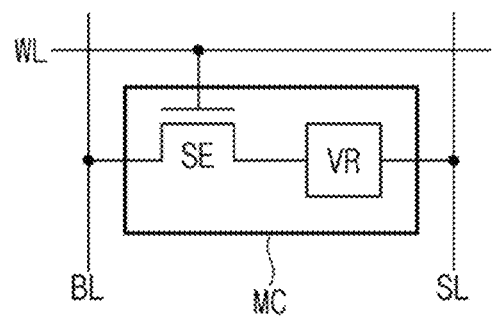
FIG. 12 illustrates an example of a memory cell of FIG. 11 according to some example embodiments of the present inventive concepts.

FIG. 12 illustrates an example of the memory cell MC of FIG. 11. In some example embodiments, an example of the memory cell MC connected with one bit line BL, one source line SL, and one word line WL is illustrated in FIG. 12. Referring to FIGS. 1, 11, and 12, the memory cell MC may include a selection transistor SE and a variable resistance element VR.

A gate of the selection transistor SE is connected to the word line WL. A first terminal of the selection transistor SE is connected to the bit line BL. A second terminal of the selection transistor SE is connected with the variable resistance element VR. The variable resistance element VR may be implemented with a phase change material, a ferroelectric material, a magnetic resistance material, or a resistance material. The memory cell MC may be implemented with a variable resistance memory cell including a phase change memory cell, a ferroelectric memory cell, a magnetic memory cell, or a resistance memory cell.

Figure 13:
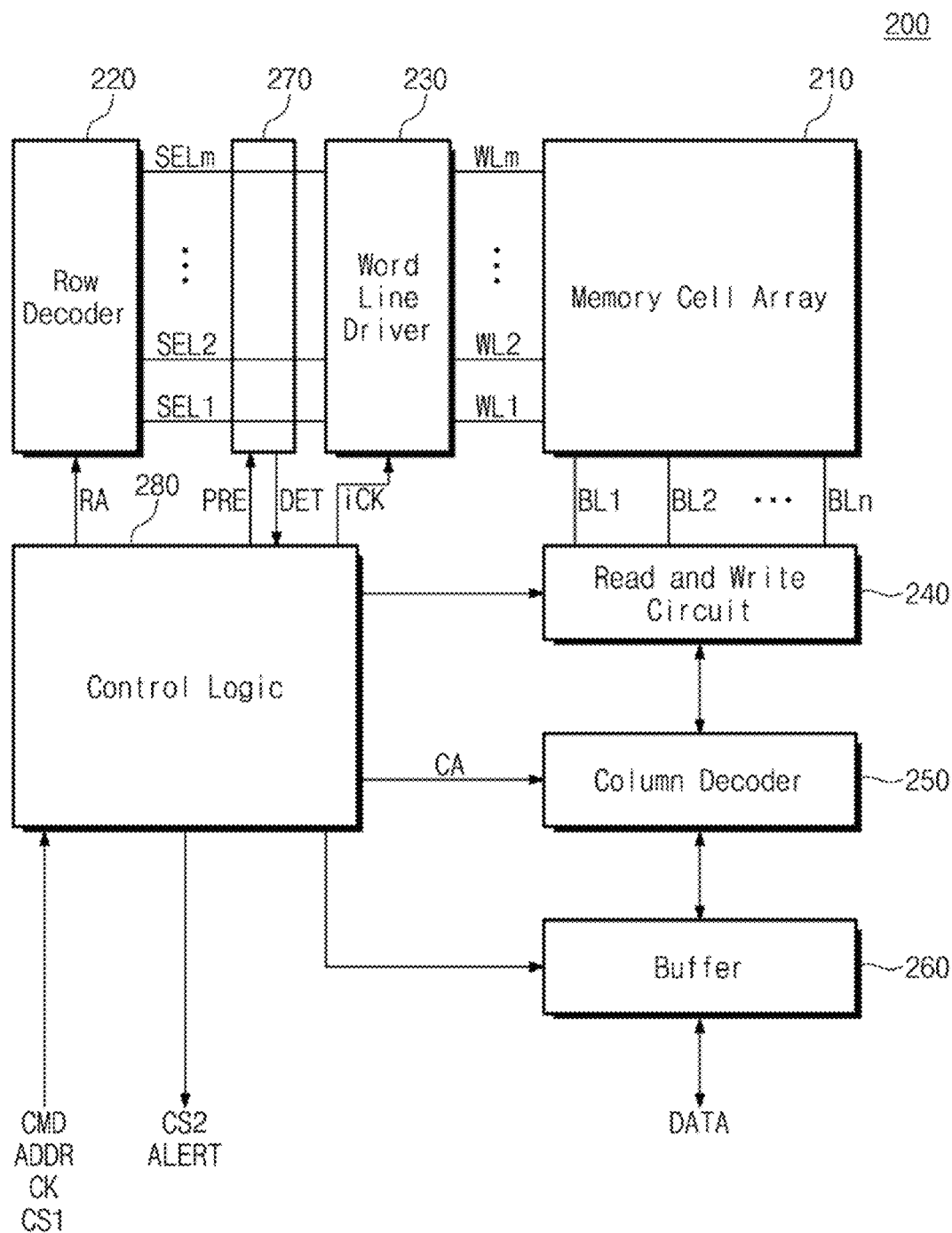
FIG. 13 illustrates a semiconductor memory device according to some example embodiments of the present inventive concepts.

FIG. 13 illustrates a semiconductor memory device 200 according to some example embodiments of the present inventive concepts. Referring to FIG. 13, the semiconductor memory device 200 may include a memory cell array 210, a row decoder 220, a word line driver 230, a read and write circuit 240, a column decoder 250, a buffer 260, a detection circuit 270, and control logic 280.

Operations and configurations of the memory cell array 210, the row decoder 220, the word line driver 230, the read and write circuit 240, the column decoder 250, the buffer 260, and the control logic 280 may be identical to those of the memory cell array 110, the row decoder 120, the word line driver 130, the read and write circuit 140, the column decoder 150, the buffer 160, and the control logic 180 described with reference to FIG. 1. Thus, additional description will be omitted to avoid redundancy.

The word line driver 230 may be connected with the first to m-th selection lines SEL1 to SELm and the first to m-th word lines WL1 to WLm, and the word line driver 230 may be configured to adjust voltages of the word lines first to m-th word lines WL1 to WLm in response to the voltages of the first to m-th selection lines SEL1 to SELm. The detection circuit 270 may be connected with the first to m-th selection lines SEL1 to SELm, not the first to m-th word lines WL1 to WLm. The detection circuit 270 may control the detection signal DET based on voltages of the first to m-th selection lines SEL1 to SELm. The detection circuit 270 may be configured to activate (e.g., generate, transmit, etc.) the detection signal DET in response to the voltages of the first to m-th selection lines SEL1 to SELm being identical at a specific timing as described herein.

Referring to FIGS. 7-8 and 13, the read and write circuit 240 may be connected with the columns of the memory cells of the memory cell array 210 through first to n-th bit lines BL1 to BLn, and the memory cells may include dynamic random access memory (DRAM) cells.

Referring to FIGS. 9-12 and 13, the read and write circuit 240 may be connected with the columns of the memory cells of the memory cell array 210 through first lines (e.g., /BL1 to /BLn as shown in FIGS. 9-10 or BL1 to BLn as shown in FIGS. 11-12) and connected with the columns of the memory cells through second lines ((e.g., BL1 to BLn as shown in FIGS. 9-10 or SL1 to SLn as shown in FIGS. 11-12), and the memory cells may include static random access memory cells or nonvolatile memory cells. Nonvolatile memory cells may include phase-change memory cells, magneto-resistive memory cells, ferroelectric memory cells, or resistive memory cells.

In some example embodiments, an operation and a configuration of the detection circuit 270 may be identical to those described with reference to FIG. 2 or FIG. 5. Thus, additional description will be omitted to avoid redundancy.

Figure 14:
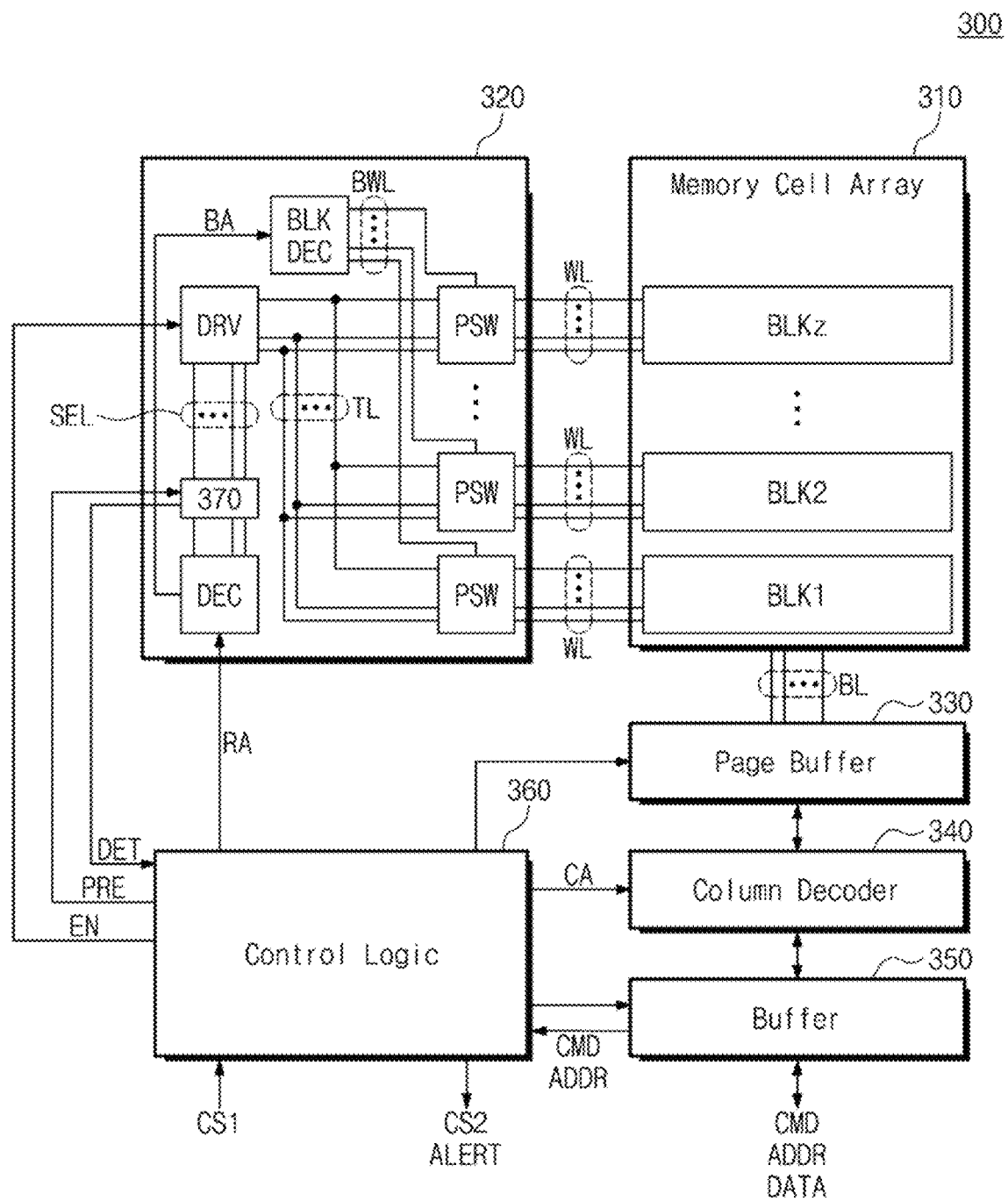
FIG. 14 illustrates a semiconductor memory device according to some example embodiments of the present inventive concepts.

FIG. 14 illustrates a semiconductor memory device 300 according to some example embodiments of the present inventive concepts. In some example embodiments, the semiconductor memory device 300 may be implemented with a NAND or NOR flash memory device. Referring to FIG. 14, the semiconductor memory device 300 may include a memory cell array 310, a row driver 320, a page buffer 330, a column decoder 340, a buffer 350, and control logic 360.

The memory cell array 310 includes a plurality of memory blocks BLK1 to BLKz, where "z" may be any positive integer. Each of the plurality of memory blocks BLK1 to BLKz includes a plurality of memory cells. Each of the plurality of memory blocks BLK1 to BLKz may be connected with the row driver 320 through word lines WL. Accordingly, the row driver 320 may be understood to be connected to the memory cell array 310 through word lines WL. Each of the plurality of memory blocks BLK1 to BLKz may be connected with the page buffer 330 through a plurality of bit lines BL. The plurality of memory blocks BLK1 to BLKz may be connected in common with the plurality of bit lines BL.

In some example embodiments, each of the plurality of memory blocks BLK1 to BLKz may be a unit of an erase operation. Memory cells belonging to each of the plurality of memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of the erase operation.

The row driver 320 is connected with the word lines WL. The row driver 320 operates under control of the control logic 360. The row driver 320 may decode the row address RA received from the control logic 360 and may control voltages to be applied to the word lines WL based on the decoded row address.

The page buffer 330 is connected with the memory cell array 310 through the plurality of bit lines BL. The page buffer 330 may exchange data "DATA" with the buffer 350 through the column decoder 340. The page buffer 330 operates under control of the control logic 360.

In a program operation, the page buffer 330 may receive the data "DATA" to be written in memory cells from the buffer 350 through the column decoder 340. The page buffer 330 may apply voltages to the plurality of bit lines BL based on the receive data. In a read operation, the page buffer 330 may sense voltages of the bit lines BL and may provide the sensed data "DATA" to the buffer 350 through the column decoder 340.

The page buffer 330 may include a plurality of storage circuits that respectively correspond to the plurality of bit lines BL and are used to store write data or read data. The plurality of storage circuits may include, for example, latches.

The column decoder 340 may transfer the data "DATA" between the page buffer 330 and the buffer 350. The column decoder 340 may receive the column address CA from the control logic 360. The column decoder 340 may connect a part of the storage circuits in the page buffer 330 with the buffer 350 based on the column address CA. That is, the column decoder 340 may select storage circuits, which will exchange data with the buffer 350, from among the storage circuits of the page buffer 330.

The buffer 350 may receive the command CMD and the address ADDR from an external device and may exchange the data "DATA" with the external device. The buffer 350 may operate under control of the control logic 360. The buffer 350 may provide the command CMD and the address ADDR to the control logic 360. The buffer 350 may exchange the data "DATA" with the page buffer 330 through the column decoder 340.

The control logic 360 may receive the command CMD and the address ADDR from the buffer 350. The control logic 360 may receive the first control signal CS1 from the external device. The control logic 360 may output the second control signal CS2 and the alert signal ALERT to the external device. The control logic 360 may output the precharge signal PRE to the row driver 320 and may receive the detection signal DET from the row driver 320.

The row driver 320 may include a decoder DEC. The decoder DEC may receive the row address RA from the control logic 360. The decoder DEC may adjust voltages of selection lines SEL, based on the row address RA.

For example, when the address overflow does not occur, the decoder DEC may set a voltage of a selection line selected from the selection lines SEL to the high level and may set voltages of the remain selection lines being not selected from among the selection lines SEL to the low level. When the address overflow occurs, the decoder DEC may maintain voltages of the selection lines SEL at an inactive state of the low level.

The row driver 320 may further include a driver DRV. The driver DRV may adjust voltages of transmission lines TL based on voltages of the selection lines SEL. For example, the driver DRV may apply a selection voltage (e.g., a program voltage or a read voltage) to a transmission line corresponding to a activated (or selected) selected selection line of the selection lines SEL. The driver DRV may apply a non-selection voltage (e.g., a pass voltage or a read pass voltage) to transmission lines corresponding to deactivated (or unselected) selection lines of the selection lines SEL. The driver DRV may receive an enable signal EN from the control logic 360. The enable signal EN may perform the same function as the internal clock signal iCK described with reference to FIGS. 1 to 13.

The row driver 320 may further include a block decoder BLKDEC. The block decoder BLKDEC may control pass switches PSW through block word lines BLKWL. The block decoder BLKDEC may receive a block address BA from the decoder DEC. Based on the block address BA (which may be received from the decoder DEC and thus may be based on the row address RA), the block decoder BLKDEC may activate a block word line selected from the block word lines BLKWL and may deactivate the remaining block word lines of the block word lines BLKWL, that is, unselected block word lines thereof. Accordingly, the block decoder BLKDEC may be configured to activate one of the pass switches PSW (e.g., an activated one pass switch PSW) and to deactivate a remainder of the pass switches PSW (e.g., all other pass switches PSW excluding the activated one pass switch PSW), based on the row address RA.

The row driver 320 may further include the plurality of pass switches PSW respectively corresponding to the plurality of memory blocks BLK1 to BLKz. The pass switches PSW may be connected with the corresponding memory block of the plurality of memory blocks BLK1 to BLKz through the word lines WL. For example, each of the pass switches PSW may be connected with a corresponding memory block (e.g., a different memory block) of the memory blocks BLK1 to BLKz through some corresponding word lines (e.g., a different selection of word lines) of the word lines WL. The pass switches PSW may be connected in common with the transmission lines TL. The pass switches PSW may be controlled by the block word lines BLKWL. The driver DRV may be connected in common with the pass switches PSW through the transmission lines TL. The driver DRV may be configured to adjust voltages of the transmission lines TL based on an enable signal EN and the voltages of the selection lines SEL.

A pass switch connected with a selected block word line from among the pass switches PSW may transfer voltages of the transmission lines TL to the word lines WL. Pass switches connected with unselected block word lines from among the pass switches PSW may not transfer voltages of the transmission lines TL to the word lines WL. For example, each of the pass switches PSW may include switches respectively corresponding to the word lines WL. A pass switch PSW activated by the block decoder BLKDEC (e.g., an activated one pass switch PSW of the pass switches PSW) may be configured to transfer the voltages of the transmission lines TL to some word lines corresponding to the activated one pass switch PSW (e.g., the particular selection of word lines via which the activated pass switch PSW is connected with a corresponding memory block of the memory blocks BLK1 to BLKz) from among the word lines WL.

The row driver 320 may further include a detection circuit 370. The detection circuit 370 may be connected with the selection lines SEL. The detection circuit 370 may receive the precharge signal PRE from the control logic 360 and may provide the detection signal DET to the control logic 360. The detection circuit 370 may be implemented as described with reference to FIG. 2 or 5. For example, the detection circuit may be configured to activate a detection signal DET in response to the voltages of the selection lines SEL being identical at a specific timing.

The control logic 360 is implemented to detect the address overflow to be identical to the method described with reference to FIG. 4 or 6, except that the enable signal EN is used instead of the internal clock signal iCK. Thus, additional description will be omitted to avoid redundancy.

Figure 15:
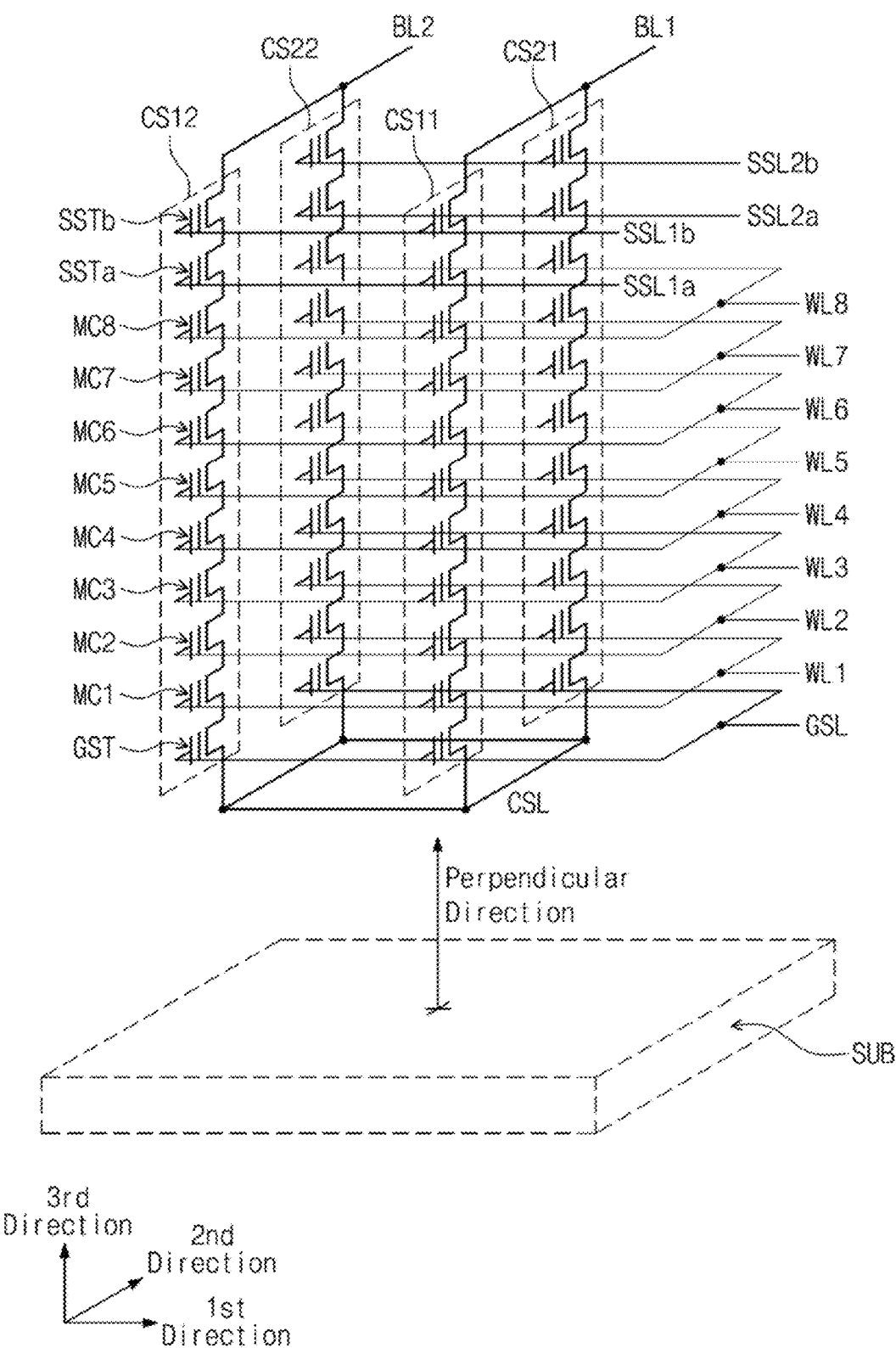
FIG. 15 is a circuit diagram illustrating an example of one memory block of memory blocks of FIG. 14 according to some example embodiments of the present inventive concepts.

FIG. 15 is a circuit diagram of an example of one memory block BLKa of the memory blocks BLK1 to BLKz of FIG. 14 according to some example embodiments of the present inventive concepts, although it will be understood that each of the memory blocks BLK1 to BLKz may have the same structure as shown for BLKa in FIG. 15. As shown in FIG. 15, each of the memory blocks BLKa to BLKz may include a substrate SUB and a plurality of cell strings CS11, CS12, CS21 and CS22 on the substrate SUB. Referring to FIG. 15, a plurality of cell strings CS11, CS12, CS21 and CS22 may be arranged on a substrate SUB in rows and columns. Each row may be extended in a first direction. Each column may be extended in a second direction. The plurality of cell strings CS may be connected in common with a common source line CSL formed on (or in) the substrate SUB. In FIG. 15, a location of the substrate SUB is depicted by way of example for better understanding of a structure of the memory block BLKa.

Cell strings of each row may be connected in common with a ground selection line GSL and may be connected with corresponding string selection lines of first and second string selection lines SSL1a, SSL1b, SSL2a and SSL2b. Cell strings of each column may be connected with a corresponding bit line of first and second bit lines BL1 and BL2.

Each cell string may include at least one ground selection transistor GST connected with the ground selection line GSL, and a plurality of memory cells MC1 to MC8 respectively connected with a plurality of word lines WL1 to WL8. Cell strings of a first row may further include at least one string selection transistor (e.g., string selection transistors SSTa and SSTb) connected with first string selection lines SSL1a and SSL1b. Cell strings of a second row may further include string selection transistors SSTa and SSTb connected with second string selection lines SSL2a and SSL2b.

In each cell string, the ground selection transistor GST, the memory cells MC1 to MC8, and the string selection transistors SSTa and SSTb may be connected in series in a direction perpendicular to the substrate SUB (e.g., stacked on the substrate in the direction that is perpendicular to the substrate), for example, a third direction and may be sequentially stacked in the direction perpendicular to the substrate SUB. In each cell string, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8 other than the dummy memory cell.

In some example embodiments, memory cells that are located at the same height and are associated with one string selection line SSL1 or SSL2 may form one physical page. Memory cells of one physical page may be connected with one sub-word line. Sub-word lines of physical pages located at the same height may be connected in common to one word line.

Figure 16:
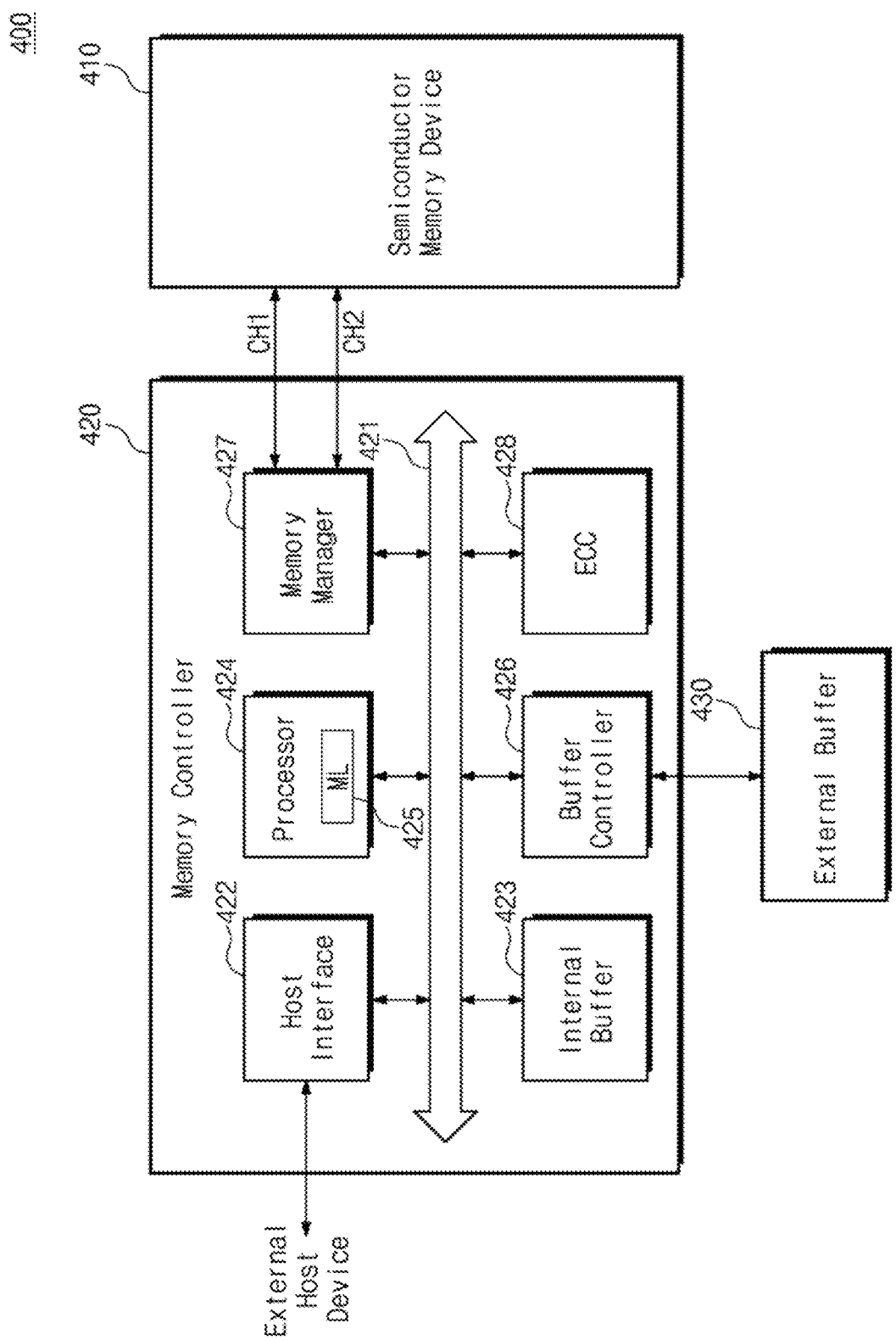
FIG. 16 illustrates a memory system according to some example embodiments of the present inventive concepts.

FIG. 16 illustrates a memory system 400 according to some example embodiments of the present inventive concepts. Referring to FIG. 16, the memory system 400 may include a semiconductor memory device 410, a memory controller 420, and an external buffer 430. The semiconductor memory device 410 may include a plurality of memory cells. Each of the plurality of memory cells may store two or more bits.

For example, the semiconductor memory device 410 may include at least one of the semiconductor memory devices 100, 200, and 300 described with reference to FIGS. 1 to 14. For example, the semiconductor memory device 410 may be implemented with at least one of various semiconductor memories such as a dynamic random access memory, a static random access memory, a phase change memory, a ferroelectric memory, a magnetic memory, a resistive memory, and a flash memory.

The memory controller 420 may receive various requests for writing data in the semiconductor memory device 410 or reading data from the semiconductor memory device 410 from an external host device. The memory controller 420 may store (or buffer) user data communicated with the external host device in the external buffer 430 and may store meta data for managing the memory system 400 in the external buffer 430.

The external buffer 430 may include a random access memory. For example, the external buffer 430 may include at least one of a dynamic random access memory, a phase change random access memory, a ferroelectric random access memory, a magnetic random access memory, and a resistive random access memory. The external buffer 430 may also include at least one of the semiconductor memory devices 100, 200, and 300 described with reference to FIGS. 1 to 14.

The memory controller 420 may include a bus 421, a host interface 422, an internal buffer 423, a processor 424, a buffer controller 426, a memory manager 427, and an error correction code (ECC) block 428. The processor 424 may be configured to execute a memory control operation associated with the memory system 400 (e.g., a read and/or write operation) based on processing a program of instructions (ML) 425 that may be stored at the processor 424 and/or in a memory that may be internal or external to the processor 424 and/or the memory controller 420.

The bus 421 may provide communication channels between the components in the memory controller 420. The host interface 422 may receive various requests from the external host device and may parse the received requests. The host interface 422 may store the parsed requests in the internal buffer 423.

The host interface 422 may send various responses to the external host device. The host interface 422 may exchange signals with the external host device in compliance with a given communication protocol. The internal buffer 423 may include a random access memory. For example, the internal buffer 423 may include a static random access memory or a dynamic random access memory.

The processor 424 may drive an operating system or firmware for driving the memory controller 420. The processor 424 may read the parsed requests stored in the internal buffer 423 and may generate commands and addresses for controlling the semiconductor memory device 410. The processor 424 may provide the generated commands and addresses to the memory manager 427.

The processor 424 may store various meta data for managing the memory system 400 in the internal buffer 423. The processor 424 may access the external buffer 430 through the buffer controller 426. The processor 424 may control the buffer controller 426 and the memory manager 427 such that user data stored in the external buffer 430 are provided to the semiconductor memory device 410.

The processor 424 may control the host interface 422 and the buffer controller 426 such that the data stored in the external buffer 430 are provided to the external host device. The processor 424 may control the buffer controller 426 and the memory manager 427 such that data received from the semiconductor memory device 410 are stored in the external buffer 430. The processor 424 may control the host interface 422 and the buffer controller 426 such that data received from the external host device are stored in the external buffer 430.

Under control of the processor 424, the buffer controller 426 may write data in the external buffer 430 or may read data from the external buffer 430. The memory manager 427 may communicate with the semiconductor memory device 410 through a first channel CH1 and a second channel CH2 under control of the processor 424.

The memory manager 427 may access the semiconductor memory device 410 under control of the processor 424. For example, the memory manager 427 may access the semiconductor memory device 410 through the first channel CH1 and the second channel CH2. The memory manager 427 may communicate with the semiconductor memory device 410, based on a protocol that is defined in compliance with the standard or is defined by a manufacturer.

The error correction code block 428 may perform error correction encoding on data to be provided to the semiconductor memory device 410 by using an error correction code ECC. The error correction code block 428 may perform error correction decoding on data received from the semiconductor memory device 410 by using the error correction code ECC.

In some example embodiments, the memory system 400 may not include the external buffer 430 and the buffer controller 426. When the external buffer 430 and the buffer controller 426 are not included in the memory system 400, the above functions of the external buffer 430 and the buffer controller 426 may be performed by the internal buffer 423.

FIG. 17 is a block diagram illustrating an electronic device 1000 including the semiconductor memory device 100, 200, or 300 or the memory system 400 according to the present inventive concepts. Referring to FIG. 17, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In some example embodiments, the electronic device 1000 may be one of various electronic devices such as an automotive system (e.g., an automobile or any vehicle), a personal computer, a laptop computer, a server, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may perform various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase change RAM (PRAM), a magneto-resistive RAM (MRAM), a resistive RAM (ReRAM), or a ferroelectric RAM (FRAM).

The storage device 1500 may store data regardless of whether a power is supplied. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive a light through a lens 1810. An image device 1820 and an image signal processor (ISP) 1830 included in the image processor 1800 may generate image information about an external object, based on a received light. The user interface 1900 may include an interface capable of exchange information with a user, except for the touch panel 1200, the display panel 1300, the audio processor 1600, and the image processor 1800. The user interface 1900 may include a keyboard, a mouse, a printer, a projector, various sensors, a human body communication device, etc.

The electronic device 1000 may further include a power management IC (PMIC) 1010, a battery 1020, and an electric generator 1030. The power management IC 1010 may generate an internal power from a power supplied from the battery 1020 or a power supplied from the electric generator 1030, and may provide the internal power to the main processor 1100, the touch panel 1200, the touch driver integrated circuit 1202, the display panel 1300, the display driver integrated circuit 1302, the system memory 1400, the storage device 1500, the audio processor 1600, the communication block 1700, the image processor 1800, and the user interface 1900.

Each of the components of the electronic device 1000 may include a safety monitor device SM. Also, the safety monitor device SM may be connected with each of channels between the components of the electronic device 1000. The safety monitor device SM may be configured to detect an error of signals and to output an alert signal when an error is detected. The electronic device 1000 may be implemented in an in-vehicle infotainment system. The safety monitor device SM may be implemented based on the ISO26262 or automotive safety integrity level (ASIL).

In some example embodiments, the system memory 1400 or the storage device 1500 may be implemented with the semiconductor memory device 100, 200, or 300 or the memory system 400 according to some example embodiments of the present inventive concepts. The system memory 1400 or the storage device 1500 may include the detection circuit 170, 270, or 370 as at least a part of the safety monitor device SM. When the address overflow is detected, the system memory 1400 or the storage device 1500 may output (e.g., generate and/or transmit) the alert signal ALERT. The alert signal ALERT, when output, may be processed by the main processor 1100 to cause the main processor 1100 to implement a corrective operation to reduce or prevent abnormal operation that might otherwise occur as a result of the address overflow. For example, in response to the control logic 180 activating the alert signal ALERT, the main processor 1100 may cause the electronic device 1000 to refrain from using data that may be associated with the address overflow, thereby reducing or preventing abnormal operation of the electronic device 1000 due to the address overflow.

As the system memory 1400 or the storage device 1500 automatically detects the address overflow and outputs the alert signal ALERT (e.g., transmits the alert signal to an external device), which may be used by the main processor 1100 to reduce or prevent abnormal operation of the electronic device 1000 due to the address overflow (e.g., causing the electronic device 1000 to refrain from using read data associated with a read operation in the system memory 1400 and/or storage device 1500 in which the address overflow is detected), the reliability of the electronic device 1000 may be further improved. When the electronic device 1000 is implemented to be installed in a vehicle, the electronic device 1000 may further improve the safety of the vehicle as reducing or preventing abnormal operation of the electronic device 1000 may reduce or prevent abnormal operation of the vehicle.

In the above example embodiments, components according to the present inventive concepts are described by using the terms "first", "second", "third", etc. However, the terms "first", "second", "third", etc. may be used to distinguish components from each other and do not limit the present inventive concepts. For example, the terms "first", "second", "third", etc. do not involve an order or a numerical meaning of any form.

In the above example embodiments, components according to some embodiments of the present inventive concepts are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

For example, as described herein, any systems, devices, electronic devices, modules, units, blocks, logic, controllers, circuitry, circuits, and/or portions thereof according to any of the example embodiments, and/or any portions thereof (including, without limitation, semiconductor memory device 100, control logic 180, semiconductor memory device 200, control logic 280, semiconductor memory device 300, control logic 360, memory system 400, semiconductor memory device 410, memory controller 420, processor 424, buffer controller 426, memory manager 427, error correction code block 428, electronic device 1000, main processor 1100, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any systems, devices, electronic devices, modules, units, blocks, logic, controllers, circuitry, circuits, and/or portions thereof according to any of the example embodiments.

According to the present inventive concepts, a semiconductor memory device may detect an address overflow based on voltages of internal wires. Because the address overflow is detected by using a simply implemented circuit, the reliability of the semiconductor memory device may be improved without an increase of the complexity and size thereof.

While the present inventive concepts have been described with reference to some example embodiments thereof, it will be apparent to those of ordinary skill in the art that various changes and modifications may be made thereto without departing from the spirit and scope of the present inventive concepts as set forth in the following claims.

What is claimed is:

1. A semiconductor memory device, comprising:
   a memory cell array including memory cells arranged in rows and columns;
   a row decoder configured to receive a row address, to decode the row address, and to adjust voltages of selection lines based on the decoded row address;
   a word line driver connected with the selection lines, the word line driver connected with the rows of the memory cells through word lines, the word line driver configured to adjust voltages of the word lines in response to an internal clock signal and the voltages of the selection lines;
   a detection circuit connected with the word lines, the detection circuit configured to activate a detection signal in response to the voltages of the word lines being identical at a specific timing; and
   control circuitry that is configured to receive a command and an address from an external device and to notify the detection circuit of the specific timing based on activating a precharge signal.

2. The semiconductor memory device of claim 1, wherein the control circuitry is configured to initialize the detection circuit during a time period outside the specific timing based on deactivating the precharge signal.

3. The semiconductor memory device of claim 1, wherein the control circuitry is configured to stop an operation corresponding to the command in response to a determination that the detection signal is activated.

4. The semiconductor memory device of claim 1, wherein the control circuitry is configured to transmit an alert signal to the external device in response to a determination that the detection signal is activated.

5. The semiconductor memory device of claim 1, wherein
   the detection circuit includes first transistors,
   gates of the first transistors are respectively connected with the word lines,
   the detection circuit is configured to apply a ground voltage to first terminals of the first transistors,
   second terminals of the first transistors are connected with a common node, and
   the detection circuit is configured to provide a voltage of the common node as the detection signal.

6. The semiconductor memory device of claim 5, wherein
   the detection circuit further includes a second transistor,
   a gate of the second transistor is configured to receive the precharge signal,
   the detection circuit is configured to apply a power supply voltage to a first terminal of the second transistor, and
   a second terminal of the second transistor is connected with the common node.

7. The semiconductor memory device of claim 6, wherein
   the first transistors are NMOS transistors, and
   the second transistor is a PMOS transistor.

8. The semiconductor memory device of claim 6, wherein,
   the second transistor is configured to charge the common node with the power supply voltage in response to deactivation of the precharge signal, and
   the second transistor is configured to stop charging of the common node with the power supply voltage in response to activation of the precharge signal.

9. The semiconductor memory device of claim 5, wherein,
   a first transistor from among the first transistors and corresponding to one word line of the word lines is configured to supply the ground voltage to the common node in response to a voltage of the one word line being different from voltages of remaining word lines of the word lines, and
   the first transistors are configured to float the common node in response to the voltages of the word lines being identical.

10. The semiconductor memory device of claim 9, wherein the control circuitry is configured to identify activation of the detection signal in response to the voltage of the common node is maintained at a power supply voltage at the specific timing.

11. The semiconductor memory device of wherein
    the detection circuit includes first transistors,
    gates of the first transistors are respectively connected with the word lines,
    the detection circuit is configured to apply a power supply voltage to first terminals of the first transistors,
    second terminals of the first transistors are connected with a common node, and
    the detection circuit is configured to provide a voltage of the common node as the detection signal.

12. The semiconductor memory device of claim 11, wherein
    the detection circuit further includes a second transistor,
    a gate of the second transistor is configured to receive the precharge signal, the detection circuit is configured to apply a ground voltage to a first terminal of the second transistor, and
a second terminal of the second transistor is connected with the common node.

13. The semiconductor memory device of claim 12, wherein
the first transistors are PMOS transistors, and
the second transistor is an NMOS transistor.

14. The semiconductor memory device of claim 1, wherein the specific timing is a timing at which, in response to the command, the word line driver applies a first voltage to a selected word line of the word lines and applies second voltages to unselected word lines of the word lines.

15. A semiconductor memory device, comprising:
a memory cell array including memory cells arranged in rows and columns;
a row decoder configured to receive a row address, to decode the row address, and to adjust voltages of selection lines based on the decoded row address;
a word line driver connected with the selection lines and word lines, the word line driver configured to adjust voltages of the word lines in response to the voltages of the selection lines; and
a detection circuit connected with the selection lines, the detection circuit configured to activate a detection signal in response to the voltages of the selection lines being identical at a specific timing.

16. The semiconductor memory device of claim 15, further comprising:
a read and write circuit connected with the columns of the memory cells through bit lines,
wherein the memory cells include dynamic random access memory cells.

17. The semiconductor memory device of claim 15, further comprising:
a read and write circuit connected with the columns of the memory cells through first lines and connected with the columns of the memory cells through second lines,
wherein the memory cells include static random access memory cells or nonvolatile memory cells, and
wherein the nonvolatile memory cells include phase-change memory cells, magneto-resistive memory cells, ferroelectric memory cells, or resistive memory cells.

18. A semiconductor memory device, comprising:
a memory cell array including memory blocks, wherein each of the memory blocks includes memory cells; and
a row driver connected with the memory cell array through word lines,
wherein the row driver includes
a decoder configured to adjust voltages of selection lines based on a row address,
pass switches respectively corresponding to the memory blocks and connected with the memory blocks through the word lines,
a driver connected in common with the pass switches through transmission lines, the driver configured to adjust voltages of the transmission lines based on an enable signal and the voltages of the selection lines,
a block decoder configured to activate one pass switch of the pass switches and to deactivate a remainder of the pass switches, based on the row address, and
a detection circuit connected with the selection lines, the detection circuit configured to activate a detection signal in response to the voltages of the selection lines being identical at a specific timing,
wherein each of the pass switches is connected with a corresponding memory block of the memory blocks through some corresponding word lines of the word lines, and
wherein the activated one pass switch of the pass switches is configured to transfer the voltages of the transmission lines to some word lines corresponding to the activated one pass switch from among the word lines.

19. The semiconductor memory device of claim 18, wherein
each of the memory blocks includes
a substrate, and
cell strings on the substrate, and
each of the cell strings includes at least one ground selection transistor, memory cells, and at least one string selection transistor stacked on the substrate in a direction that is perpendicular to the substrate, wherein the memory cells are connected with corresponding word lines of the word lines.

* * * * *